(12) United States Patent
Rastegar et al.

(10) Patent No.: US 9,587,924 B2
(45) Date of Patent: Mar. 7, 2017

(54) SHOCK DETECTION CIRCUIT AND METHOD OF SHOCK DETECTION

(71) Applicants: Jahangir S Rastegar, Stony Brook, NY (US); Dake Feng, Kings Park, NY (US)

(72) Inventors: Jahangir S Rastegar, Stony Brook, NY (US); Dake Feng, Kings Park, NY (US)

(73) Assignee: OMNITEK PARTNERS LLC, Ronkonkoma, NY (US)

(*) Notice: Subject to any disclaimer, the term of this patent is extended or adjusted under 35 U.S.C. 154(b) by 751 days.

(21) Appl. No.: 13/783,251

(22) Filed: Mar. 2, 2013

(65) Prior Publication Data

US 2013/0180423 A1 Jul. 18, 2013

Related U.S. Application Data

(63) Continuation-in-part of application No. 13/207,355, filed on Aug. 10, 2011, now Pat. No. 8,776,688, which is a continuation-in-part of application No. 12/164,096, filed on Jun. 29, 2008, now Pat. No. 8,042,469.

(60) Provisional application No. 60/958,948, filed on Jul. 10, 2007.

(51) Int. Cl.
*F42C 11/02* (2006.01)
*F42C 11/00* (2006.01)
*G01R 31/36* (2006.01)
*F42C 15/24* (2006.01)
*F42C 15/40* (2006.01)

(52) U.S. Cl.
CPC .............. *F42C 11/00* (2013.01); *F42C 11/02* (2013.01); *F42C 15/24* (2013.01); *F42C 15/40* (2013.01); *G01R 31/362* (2013.01)

(58) Field of Classification Search
USPC ........ 102/206, 207, 208, 209, 210, 215, 247, 102/248
See application file for complete search history.

(56) References Cited

U.S. PATENT DOCUMENTS

| | | | | |
|---|---|---|---|---|
| 3,670,653 A * | 6/1972 | Lunt et al. | .................... | 102/210 |
| 3,808,975 A * | 5/1974 | Stutzle et al. | ................ | 102/210 |
| 3,850,102 A * | 11/1974 | Morrow | ........................ | 102/210 |
| 3,952,660 A * | 4/1976 | Davis et al. | .................. | 102/207 |
| 3,967,555 A * | 7/1976 | Gawlick et al. | ............. | 102/210 |
| 4,015,530 A * | 4/1977 | Dick | ............................. | 102/213 |
| 4,632,032 A * | 12/1986 | Muller | ......................... | 102/206 |
| 4,793,256 A * | 12/1988 | Webb | ............................ | 102/210 |
| 5,033,382 A * | 7/1991 | Webb | ............................ | 102/235 |
| 5,157,220 A * | 10/1992 | Schaffhauser et al. | ....... | 102/210 |
| 5,269,223 A * | 12/1993 | Mattsson et al. | ............ | 102/210 |

(Continued)

*Primary Examiner* — Benjamin P Lee

(57) ABSTRACT

A shock detection circuit including: an electrical energy generating device configured to generate a voltage over a duration responsive to an acceleration of the munition; an input configured for receiving an input voltage over a duration responsive to the acceleration; an electrical storage device configured to receive a portion of the input voltage over the duration and to thereby accumulate a charge, an output coupled to the electrical storage device; a first diode having a first anode coupled to the input and a first cathode coupled to the electrical storage device; and a comparator configured to compare a voltage at the output and a reference voltage and to produce a result based on the comparison.

18 Claims, 24 Drawing Sheets

(56) References Cited

U.S. PATENT DOCUMENTS

| | | | |
|---|---|---|---|
| 5,377,592 A * | 1/1995 | Rode et al. | 102/210 |
| 5,435,248 A * | 7/1995 | Rode et al. | 102/210 |
| 5,440,990 A * | 8/1995 | Wiedefeld et al. | 102/215 |
| 5,756,927 A * | 5/1998 | Fixell et al. | 102/264 |
| 6,729,240 B1 * | 5/2004 | Smith et al. | 102/206 |
| 7,124,689 B2 * | 10/2006 | Davis et al. | 102/216 |
| 7,227,235 B2 * | 6/2007 | Kroupenkine et al. | 257/400 |
| 7,231,874 B2 * | 6/2007 | Rastegar et al. | 102/207 |
| 7,285,868 B2 * | 10/2007 | Wilson | 290/1 R |
| 7,312,557 B2 * | 12/2007 | Rastegar et al. | 310/339 |
| 7,906,861 B2 * | 3/2011 | Guerrero et al. | 290/1 R |
| 8,151,707 B1 * | 4/2012 | Lasut | 102/215 |
| 2003/0041767 A1 * | 3/2003 | Rastegar et al. | 102/207 |
| 2007/0204756 A1 * | 9/2007 | Rastegar et al. | 102/210 |
| 2012/0291650 A1 * | 11/2012 | Aw et al. | 102/207 |

* cited by examiner

SHOCK DETECTION CIRCUIT AND METHOD OF SHOCK DETECTION

CROSS-REFERENCE TO RELATED APPLICATIONS

This application is a continuation-in-part application of U.S. application Ser. No. 13/207,355, filed on Aug. 10, 2011, which is a continuation-in-part application of U.S. application Ser. No. 12/164,096 filed on Jun. 29, 2008, which claims the benefit of prior filed U.S. Provisional Application No. 60/958,948 filed on Jul. 10, 2007, the contents of each of which is incorporated herein by reference. This application is related to U.S. Patent Application Publication No. 2008/0129151 filed on Dec. 3, 2007, the contents of which is also incorporated herein by reference.

BACKGROUND OF THE INVENTION

1. Field of the Invention

The present invention relates generally to a shock detection circuit and method of shock detection, and more particularly to a shock detection circuit and method of shock detection for use in munitions, industrial machinery and the like.

2. Prior Art

Thermal batteries represent a class of reserve batteries that operate at high temperatures. Unlike liquid reserve batteries, in thermal batteries the electrolyte is already in the cells and therefore does not require a distribution mechanism such as spinning. The electrolyte is dry, solid and non-conductive, thereby leaving the battery in a non-operational and inert condition. These batteries incorporate pyrotechnic heat sources to melt the electrolyte just prior to use in order to make them electrically conductive and thereby making the battery active. The most common internal pyrotechnic is a blend of Fe and $KClO_4$. Thermal batteries utilize a molten salt to serve as the electrolyte upon activation. The electrolytes are usually mixtures of alkali-halide salts and are used with the $Li(Si)/FeS_2$ or $Li(Si)/CoS_2$ couples. Some batteries also employ anodes of $Li(Al)$ in place of the $Li(Si)$ anodes. Insulation and internal heat sinks are used to maintain the electrolyte in its molten and conductive condition during the time of use. Reserve batteries are inactive and inert when manufactured and become active and begin to produce power only when they are activated.

Thermal batteries have long been used in munitions and other similar applications to provide a relatively large amount of power during a relatively short period of time, mainly during the munitions flight. Thermal batteries have high power density and can provide a large amount of power as long as the electrolyte of the thermal battery stays liquid, thereby conductive. The process of manufacturing thermal batteries is highly labor intensive and requires relatively expensive facilities. Fabrication usually involves costly batch processes, including pressing electrodes and electrolytes into rigid wafers, and assembling batteries by hand. The batteries are encased in a hermetically-sealed metal container that is usually cylindrical in shape. Thermal batteries, however, have the advantage of very long shelf life of up to 20 years that is required for munitions applications.

Thermal batteries generally use some type of igniter to provide a controlled pyrotechnic reaction to produce output gas, flame or hot particles to ignite the heating elements of the thermal battery. Currently, the following two distinct classes of igniters are available for use in thermal batteries.

The first class of igniters operates based on externally provided electrical energy. Such externally powered electrical igniters, however, require an onboard source of electrical energy, such as a battery or other electrical power source with related shelf life and/or complexity and volume requirements to operate and initiate the thermal battery. Currently available electric igniters for thermal batteries require external power source and decision circuitry to identify the launch condition and initiate the pyrotechnic materials, for example by sending an electrical pulse to generate heat in a resistive wire. The electric igniters are generally smaller than the existing inertial igniters, but they require some external power source and decision making circuitry for their operation, which limits their application to larger munitions and those with multiple power sources.

The second class of igniters, commonly called "inertial igniters", operate based on the firing acceleration. The inertial igniters do not require onboard batteries for their operation and are thereby used often in high-G munitions applications such as in non-spinning gun-fired munitions and mortars. This class of inertial igniters is designed to utilize certain mechanical means to initiate the ignition. Such mechanical means include, for example, the impact pins to initiate a percussion primer or impact or rubbing acting between one or two part pyrotechnic materials. Such mechanical means have been used and are commercially available and other miniaturized versions of them are being developed for thermal battery ignition and the like.

In general, both electrical and inertial igniters, particularly those that are designed to operate at relatively low impact levels, have to be provided with the means for distinguishing events such as accidental drops or explosions in their vicinity from the firing acceleration levels above which they are designed to be activated. This means that safety in terms of prevention of accidental ignition is one of the main concerns in all igniters.

In recent years, new and improved chemistries and manufacturing processes have been developed that promise the development of lower cost and higher performance thermal batteries that could be produced in various shapes and sizes, including their small and miniaturized versions. However, the existing inertial igniters are relatively large and not suitable for small and low power thermal batteries, particularly those that are being developed for use in fuzing and other similar applications, and electrical igniters require some external power source and decision making circuitry for their operation, making them impractical for use in small and low power thermal battery applications.

In addition, the existing inertial igniters are not capable of allowing delayed initiation of thermal batteries, i.e., initiation a specified (programmed) and relatively long amount of time after the projectile firing. Such programmable delay time capability would allow thermal batteries, particularly those that are used to power guidance and control actuation devices or other similar electrical and electronic devices onboard gun-fired munitions and mortars to be initiated a significant amount of time into the flight. In such applications, particularly when electrical actuation devices are used, a significant amount of electrical power is usually required later during the flight to aggressively guide the projectile towards the target. Thus, by delaying thermal battery initiation to when the power is needed, the performance of the thermal battery is significantly increased and in most cases it would also become possible to reduce the overall size of the thermal battery and its required thermal insulation.

A review of the aforementioned merits and shortcomings of the currently available electrical and inertial igniters clearly indicates that neither one can satisfy the need of many thermal batteries, particularly the small and miniature thermal batteries and the like, for small size igniters that are programmable to provide the desired initiation delay time and to operate safely by differentiating all-fire and various no-fire events such as accidental drops and vibration and impact during transportation and loading and even nearby explosions.

A review of the aforementioned merits and shortcomings of the currently available electrical and inertial igniters also clearly indicates the advantages of electrical initiation in terms of its reliability and small size of electrical initiation elements such as electrical matches, the possibility of providing "programmable" decision making circuitry and logic to achieve almost any desired all-fire and no-fire acceleration profiles with the help of an acceleration measuring sensor, and to provide the means to program initiation of the thermal battery or the like a specified amount of time post firing or certain other detected event, but also their main disadvantage in terms of their requirement of external batteries (or other power sources) and electronic and electric circuitry and logic and acceleration sensors for the detection of the all-fire event. On the other hand, the review also indicates the simplicity of the design and operation of inertial igniters in differentiating all-fire conditions from no-fire conditions without the use of external acceleration sensors and external power sources.

SUMMARY OF THE INVENTION

A need therefore exists for miniature electrically initiated igniters for thermal batteries and the like, particularly for use in gun-fired smart munitions, mortars, small missiles and the like, that operate without external power sources and acceleration sensors and circuitry and incorporate the advantages of both electrical igniters and inertial igniters that are currently available. Such miniature electrically initiated igniters are particularly needed for very small, miniature, and low power thermal batteries and other similar applications. For example, flexible and conformal thermal batteries for sub-munitions applications may occupy volumes as small as 0.006 cubic inches (about 100 cubic millimeters). This small thermal battery size is similar in volume to the inertial igniters currently available and used in larger thermal batteries.

An objective of the present invention is to provide a new class of "inertial igniters" that incorporates electrical initiation of the pyrotechnic materials without the need for external batteries (or other power sources). The disclosed igniters are hereinafter referred to as "electrically initiated inertial igniters". The disclosed "electrically initiated inertial igniters" utilize the firing acceleration to provide electrical power to the igniter electronics and decision making circuitry, start the initiation timing when the all-fire condition is detected, and electrically initiate the pyrotechnic materials at the specified time into the flight. In addition, electrical initiation of pyrotechnic materials is generally more reliable than impact or rubbing type of pyrotechnic initiation. In addition, electronic circuitry and logic are more readily configured to be programmable to the specified all-fire and no-fire conditions.

The method of providing electrical power includes harvesting electrical energy from the firing acceleration by, for example, using active materials such as piezoelectric materials. The method of providing electrical power also includes activation of certain chemical reserve micro-battery using the aforementioned harvested electrical energy, which would in turn provide additional electrical energy to power different components of the "electrically initiated inertial igniter".

The disclosed "electrically initiated inertial igniters" can be miniaturized and produced using mostly available mass fabrication techniques used in the electronics industry, and should therefore be low cost and reliable.

To ensure safety and reliability, all inertial igniters, including the disclosed "electrically initiated inertial igniters" must not initiate during acceleration events which may occur during manufacture, assembly, handling, transport, accidental drops, etc. Additionally, once under the influence of an acceleration profile particular to the firing of the ordinance, i.e., an all-fire condition, the igniter must initiate with high reliability. In many applications, these two requirements compete with respect to acceleration magnitude, but differ greatly in their duration. For example:

An accidental drop may well cause very high acceleration levels—even in some cases higher than the firing of a shell from a gun. However, the duration of this accidental acceleration will be short, thereby subjecting the inertial igniter to significantly lower resulting impulse levels.

It is also conceivable that the igniter will experience incidental long-duration acceleration and deceleration cycles, whether accidental or as part of normal handling or vibration during transportation, during which it must be guarded against initiation. Again, the impulse input to the igniter will have a great disparity with that given by the initiation acceleration profile because the magnitude of the incidental long-duration acceleration will be quite low.

The need to differentiate accidental and initiation acceleration profiles by their magnitude as well as duration necessitates the employment of a safety system which is capable of allowing initiation of the igniter only during all-fire acceleration profile conditions are experienced.

In addition to having a required acceleration time profile which should initiate the igniter, requirements also commonly exist for non-actuation and survivability. For example, the design requirements for actuation for one application are summarized as:

1. The device must fire when given a [square] pulse acceleration of 900 G±150 G for 15 ms in the setback direction.

2. The device must not fire when given a [square] pulse acceleration of 2000 G for 0.5 ms in any direction.

3. The device must not actuate when given a ½-sine pulse acceleration of 490 G (peak) with a maximum duration of 4 ms.

4. The device must be able to survive an acceleration of 16,000 G, and preferably be able to survive an acceleration of 50,000 G.

The electrical and electronic components of the disclosed electrically initiated inertial igniters are preferably fabricated on a single platform ("chip"), and are integrated into either the cap or interior compartment of thermal batteries or the like, in either case preferably in a hermetically sealed environment. The disclosed electrically initiated inertial igniters should therefore be capable of readily satisfying most munitions requirement of 20-year shelf life and operation over the military temperature range of −65 to 165 degrees F., while withstanding high G firing accelerations.

Some of the features of the disclosed "electrically initiated inertial igniters" for thermal batteries for gun-fired projectiles, mortars, sub-munitions, small rockets and the like include:

1. The disclosed (miniature) electrically initiated inertial igniters are capable of being readily "programmed" to almost any no-fire and all-fire requirements or multiple predefined setback environments. For these reasons, the disclosed miniature electrically initiated inertial igniters are ideal for almost any thermal battery applications, including conformal small and low power thermal batteries for fuzing and other similar munitions applications.
2. The disclosed (miniature) electrically initiated inertial igniters can be fabricated entirely on a chip using existing mass fabrication technologies, thereby making them highly cost effective and very small in size and volume.
3. The disclosed (miniature) electrically initiated inertial igniters do not require any external power sources for their operation.
4. In those applications in which the thermal battery power is needed for guidance and control close to the target, the disclosed (miniature) electrically initiated igniters can be programmed to initiate ignition long after firing, thereby eliminating the effects of thermal battery cooling.
5. The disclosed (miniature) electrically initiated inertial igniters are solid-state in design. Their final total volume is therefore expected to be significantly less than those of currently available electrical and inertial igniters.
6. The disclosed (miniature) electrically initiated inertial igniter is capable of electric initiation of Zr/BaCrO4 heat paper mixtures or their equivalents as is currently practiced in thermal batteries.
7. The disclosed (miniature) electrically initiated inertial igniters are readily packaged in sealed housings using commonly used mass-manufacturing techniques. As a result, safety and shelf life of the igniter, thermal battery and the projectile is significantly increased.
8. The solid-state and sealed design of the disclosed (miniature) electrically initiated inertial igniters should easily provide a shelf life of over 20 years and capability to operate within the military temperature range of −65 to 165 degrees F.
9. The disclosed (miniature) electrically initiated inertial igniters can be designed to withstand very high-G firing accelerations in excess of 50,000 Gs.
10. The disclosed (miniature) electrically initiated inertial igniters are programmable for any no-fire and all-fire requirements and delayed initiation time following an all-fire event. The disclosed igniters could therefore be used with other electrically activated igniters for thermal batteries, munitions or other similar applications.
11. The disclosed (miniature) electrically initiated inertial igniters can be designed to conform to any geometrical shape of the available space and thermal batteries.

Accordingly, an electrically initiated inertial igniter for a munition is provided. The electrically initiated inertial igniter comprising: an electrical energy generating device configured to generate a voltage over a duration responsive to an acceleration of the munition; a first electrical storage device connected to the electrical energy generating device through a voltage divide circuit to receive a portion of the voltage over the duration; a second electrical storage device connected to the electrical energy generating device to accumulate the voltage; and a circuit powered by a connection to the electrical energy generating device, the circuit configured to determine an all-fire condition based on both a connection to the first electrical storage device that receives the portion of the voltage and the duration of voltage generation and a predetermined accumulated voltage of the second electrical storage device.

The electrical energy generating device can be a piezoelectric generator.

The electrically initiated inertial igniter can further comprise a resistor connected to the first electrical storage device to drain a charge accumulated in the first electrical storage device resulting from non-firing events.

The circuit can comprise: a reset circuit; and a comparator comprising: a first input connected to the first electrical storage, a second input connected to a reference voltage, a third input connected to the reset circuit, and an output that produces an indication of the all-fire condition in response to the predetermined accumulated voltage in the electrical storage device, wherein the reset circuit is configured to reset the indication when the electrical energy generating device begins to generate a voltage.

Also provided is a method for electrically initiating an inertial igniter for a munition. The method comprising acts of: providing an electrical energy generating device to generate a voltage over a duration responsive to an acceleration of the munition; providing a first electrical storage device connected to the electrical energy generating device through a voltage divide circuit to receive a portion of the voltage over the duration; providing a second electrical storage device connected to the electrical energy generating device to accumulate the voltage; and providing a circuit powered by a connection to the electrical energy generating device, the circuit determining an all-fire condition based on both a connection to the first electrical storage device that receives the portion of the voltage and the duration of voltage generation and a predetermined accumulated voltage of the second electrical storage device.

BRIEF DESCRIPTION OF THE DRAWINGS

These and other features, aspects, and advantages of the apparatus of the present invention will become better understood with regard to the following description, appended claims, and accompanying drawings where:

FIG. 5 illustrates an alternative piezoelectric powered programmable event detection and logic circuitry for differentiating all no-fire events from all-fire events and to initiate igniter with a programmed time delay for medium caliber rounds and the like.

FIG. 14 illustrates the method of using the safety and all-fire detection circuitry of embodiment of FIG. 13 to design passive initiators for pyrotechnic material or the like.

DETAILED DESCRIPTION OF THE PREFERRED EMBODIMENT

Figure 1:
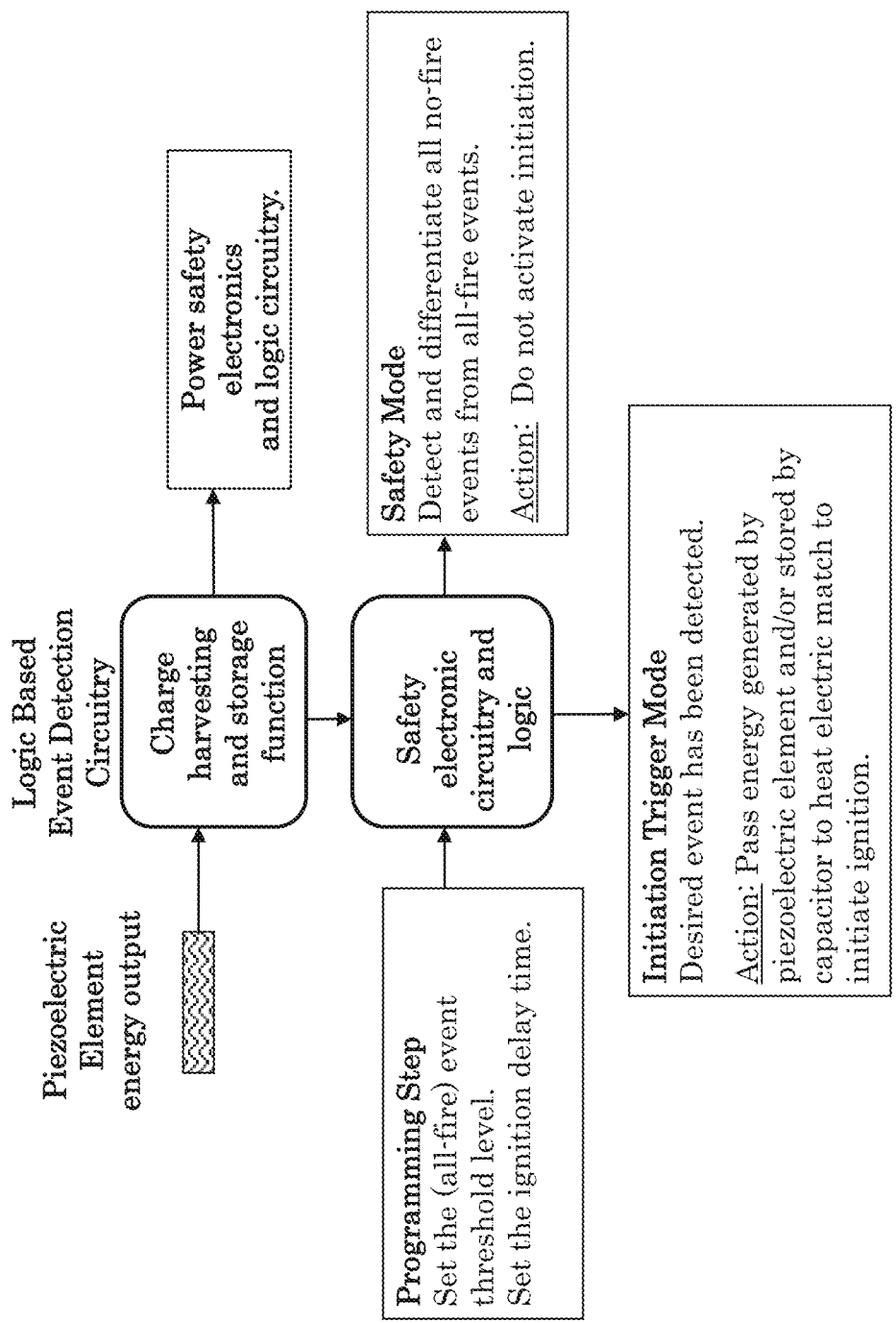
FIG. 1 illustrates the block diagram of the first class of the disclosed piezoelectric element based class of programmable electrically initiated inertial igniter embodiments.

The block diagram of a first embodiment of a programmable electrically initiated inertial igniter is shown in FIG. 1. In this embodiment, an appropriately sized piezoelectric element (different options of which are described later in this disclosure) is used, which responds to the axial accelerations and/or decelerations of the munitions or the like, to which it is affixed via a thermal battery or the like. In response to the aforementioned axial accelerations and/or decelerations of the piezoelectric element, a charge is generated on the piezoelectric element due to the resulting forces acting on the piezoelectric element due to its mass and the mass of other elements acting on the piezoelectric element (if any). As a result, the sign of the corresponding voltage on the piezoelectric element would readily indicate the direction of the axial acceleration that is applied to the munitions due to the firing or accidental dropping or other similar no-fire conditions.

However, the detection of the generated piezoelectric element voltage levels alone is not enough to ensure safety by distinguishing between no-fire and all-fire conditions. This is the case since in certain accidental events such as direct dropping of the igniter, thermal battery and/or the munitions, the acceleration levels that are experienced by the igniter may be well above that of the specified all-fire acceleration level requirements. For example, when an igniter is dropped over a hard surface, it might experience acceleration levels of up to 2000 Gs for an average duration of up to 0.5 msec. However, the all-fire acceleration level may be significantly lower, for example around 500 Gs, with the difference being in its duration, which may be around 8-15 msec.

In addition, it is desired to harvest the electrical energy generated by the piezoelectric elements and store the electrical energy in a storage device such as a capacitor to power the igniter electronics circuitry and logics and to initiate the electrical ignition element when all-fire conditions are detected. Then if the voltage of the storage device such as the capacitor is to be monitored for the detection of the all-fire conditions, then very long term vibration type oscillatory accelerations and decelerations of relatively low levels which may be experienced during transportation or the like may also bring the voltage of the storage capacitor to the level corresponding to the all-fire levels. It is therefore evident that the voltage levels generated by active elements such as piezoelectric elements alone, or total accumulated energy cannot be used to differentiate no-fire conditions from all-fire conditions in all munitions since it may have been generated over relatively long periods of time due to vibration or other oscillatory motions of the device during transportation or the like.

Thus, to achieve one single electrically initiated inertial igniter design that could work for different types of munitions and the like, the igniter has to be capable of differentiating no-fire high-G but low duration acceleration profiles from those of all-fire and significantly longer duration acceleration profiles. The device must also differentiate between low amplitude and long term acceleration profiles due to vibration and all-fire acceleration profiles.

Obviously, if in certain munitions the all-fire acceleration levels were significantly higher than the no-fire acceleration levels, then the aforementioned voltage levels of the piezoelectric element used in an igniter device could be used as a threshold to activate the heating element (wire electrode) to initiate the pyrotechnic material or initiate the initiation "delay timing clock". However, since the all-fire acceleration levels are lower than the no-fire acceleration levels in some munitions, therefore to achieve one single electrically initiated inertial igniter design that could work for all different types of munitions; the igniter has to be capable of differentiating the two events based on the duration of the experienced acceleration profile. In any case, the igniter device must still differentiate long term low acceleration vibration profiles from those of all-fire acceleration profiles.

The block diagram of FIG. 1 shows the general schematics of an embodiment of an electrically initiated inertial igniter. In the igniter of FIG. 1, at least one piezoelectric element is used to generate a charge (electrical energy) in response to the acceleration and/or deceleration profile that it experiences due to all no-fire and all-fire events. The charge generated by the piezoelectric element is then used to power the detection and safety electronics and logic circuitry and the detonation capacitor and its activation circuitry, as described later in this disclosure. In one embodiment, the electrical energy from the piezoelectric element is stored in a separate and relatively small capacitor that would act as a controlled power source to power the logic circuit. This power, supplied by the charged capacitor, would be used to activate the monitoring circuit logic to provide functionality, allowing for a range of triggering events to be detected from the piezoelectric element that are not directly coupled to peak voltage or energy detection of the piezoelectric element. In this way, circuits can be designed as described below to prevent detection of momentary spike voltage that could be accidentally generated by random vibrations or accidental droppings or other similar accidental events, indicating a false ignition condition.

The design of the electronics of a programmable electrically initiated inertial igniter is intended to address the following two basic requirements. The first requirement is to ensure safety and reliability of the thermal battery which must not be initiated during accidental drops, transportation vibration, manufacturing or other handling, miss-fire conditions and the like. The second requirement, which is achievable in a miniature igniter only with electronics circuitry, is related to one of the key benefits added by electrically operated ignition systems, i.e., the control of the time of battery initiation, which would allow munitions design engineer to have better control over the power budget and the mission profile of the guided rounds. Furthermore, by having the ability to initiate thermal battery at any point of time during the flight of a round allows munitions designer to optimize the size and efficiency of the thermal battery by operating it at optimum temperature and thereby reduce its required size.

The following two basic and general event detection, safety and ignition electronics and logic circuitry options may be used in the various embodiments disclosed herein. It is, however, appreciated by those skilled in the relevant art that other variations of the present detection and logic circuitry may also be constructed to perform the desired functions, which are intended to be within the scope and spirit of the present disclosure.

Figure 2:
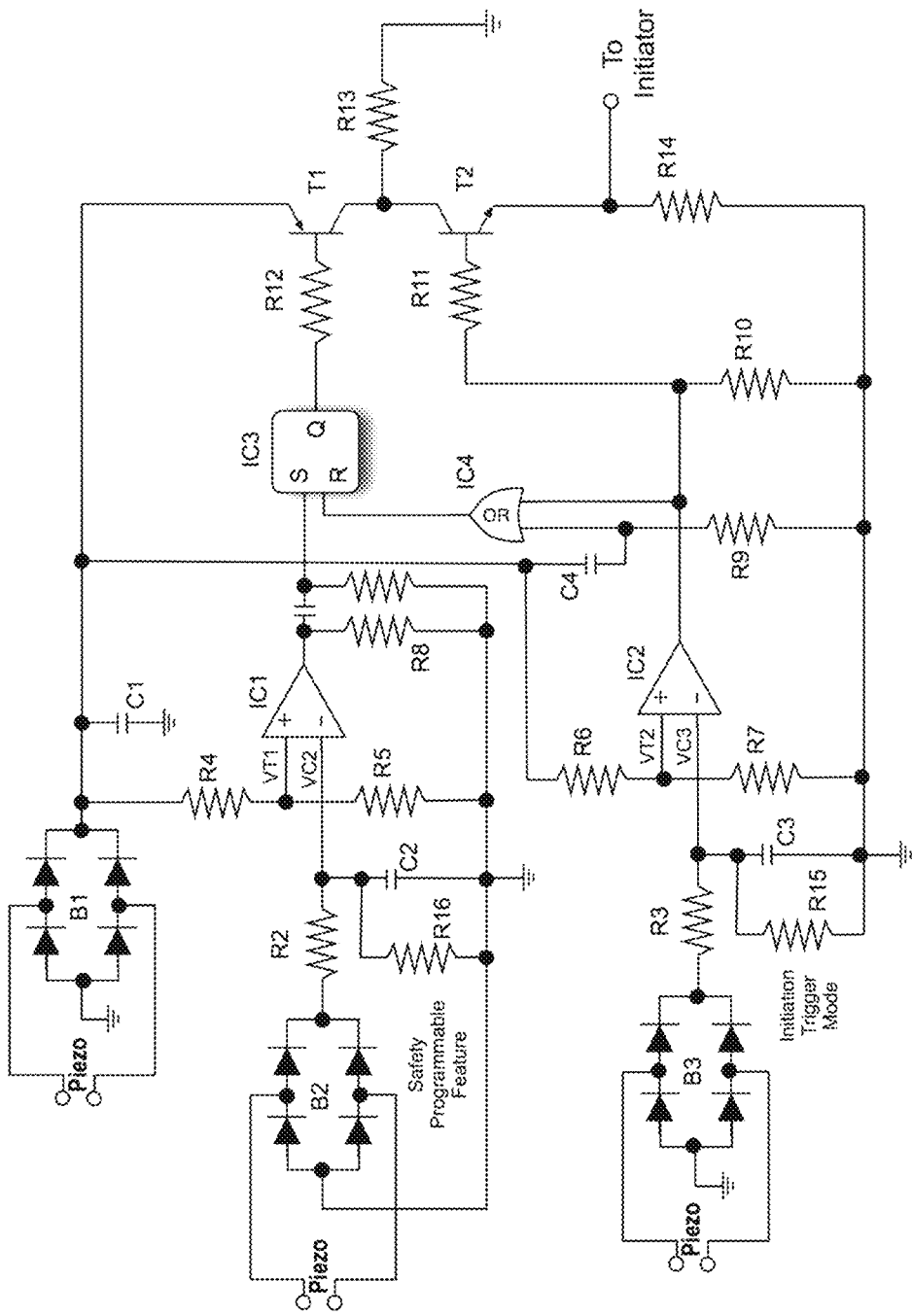
FIG. 2 illustrates the piezoelectric powered programmable event detection and logic circuitry for differentiating all no-fire events from all-fire events and to initiate igniter only when all-fire event is detected.

FIG. 2 shows the basic diagram of one possible design of the electronics circuitry for use in a piezoelectric element powered electrically initiated inertial igniter. The circuitry shown in FIG. 2 is not designed to provide a programmable initiation time delay. This feature is shown in a subsequent embodiment described below. The circuitry functions as a reusable power source based on harvesting energy from the at least one piezoelectric element and storing the harvested energy in the capacitor C1. A dedicated safety feature function (Safety Programming Feature) detects accidental drop or other accidental vibration or impact and determines when it is safe to initiate the battery. A third dedicated function (Initiation Trigger Mode) operates the initiation device which starts the battery initiation process, i.e., to ignite the igniter pyrotechnic material. The circuit incorporates circuitry to compare thresholds of energy generated by events and compares these thresholds with appropriately selected reference voltages at IC1 and IC2 to operate logic that drives the output switching stages T1 and T2.

The circuitry in FIG. 2 receives energy from at least one piezoelectric element that converts mechanical energy harvested from the firing acceleration into electrical charge. Diode bridge B1, rectifies this energy and dumps it into the capacitor C1 which is sufficiently large to serve as a power supply to the rest of the circuitry. The diode bridge B2 converts a very small portion of the energy generated by the piezoelectric generator to operate the Safety Programmable Feature and charges the capacitor C2. The energy stored in the capacitor C2 is measured by the resistor R2 and discharge resistor R16. The voltage at C2 (VC2) is compared with (VT1) at the midpoint of R4 and R5. When VC2 is higher than VT1, the output of IC1 become transitions to a high state and sets flip-flop IC3 and the flip-flop output Q transitions to a high state which causes switching transistor T1 to open and not allow power from reaching the initiator.

The initiator trigger mode operates in a similar fashion except that the time constant of R3 and C3 and bleed resistor R15 is significantly greater than the time constant of the Safety Programmable Feature. Similar to the operation of IC1, IC2 verifies that the voltage at C3 (VC3) is greater than the voltage VT2. When this occurs the output of IC2 transitions to a high state and causes switching transistor T2 to conduct and power the initiator. Note that this could only happen if the transistor T1 is enabled to conduct (IC1 output, Q, is low).

The logic circuits IC3 and IC4 operate to ensure that the initiator cannot be activated when accidental energy is generated by the piezoelectric element, such as during an accidental drop, transportation vibration or other handling situations. The sequence of operation is as follows: when the power first turns on, IC3 is reset by the OR circuit, this ensures that IC3 is now ready to detect accidental energy. Note that this enables T1 to provide power to T2. However, switching transistor T2 is open which prevents T2 from powering the initiator of the battery. The function of the OR circuit is to initialize IC3 when the power first turns on and also to initialize IC3 when an all-fire signal occurs. Initializing IC3 will allow the firing circuit comprised of switching transistor T1 and T2 to be able to power the initiator.

Figure 3:
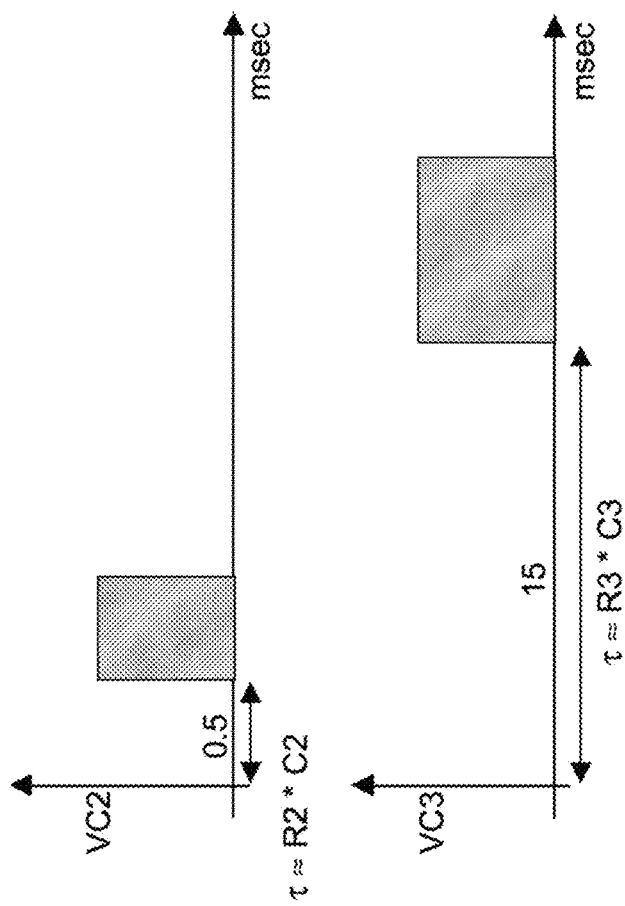
FIG. 3 illustrates a comparison of an accidental drop from the firing acceleration induced voltages.

The overall functionality of the electrically initiated inertial igniter circuitry is controlled by the Safety Programmable Feature (SPF) time constant and by the Initiation Trigger Mode (ITM) time function. For example, for the aforementioned no-fire and all-fire requirements, the SPF time constant is 0.5 msec and the ITM time constant is 15 msec. Thus the safety feature will always occur first as shown in FIG. 3. In situations such as transportation of the device in which the thermal battery or the like is mounted, the device will be subjected to continuing vibration or vibration like oscillatory loading. In such situations, when the vibration continues, the present device would still provide for safety and prevents the initiator from being powered. The safety cushion is governed by a time constant of 14.5 msec, which is controlled by both R2 and R3.

Figure 4:
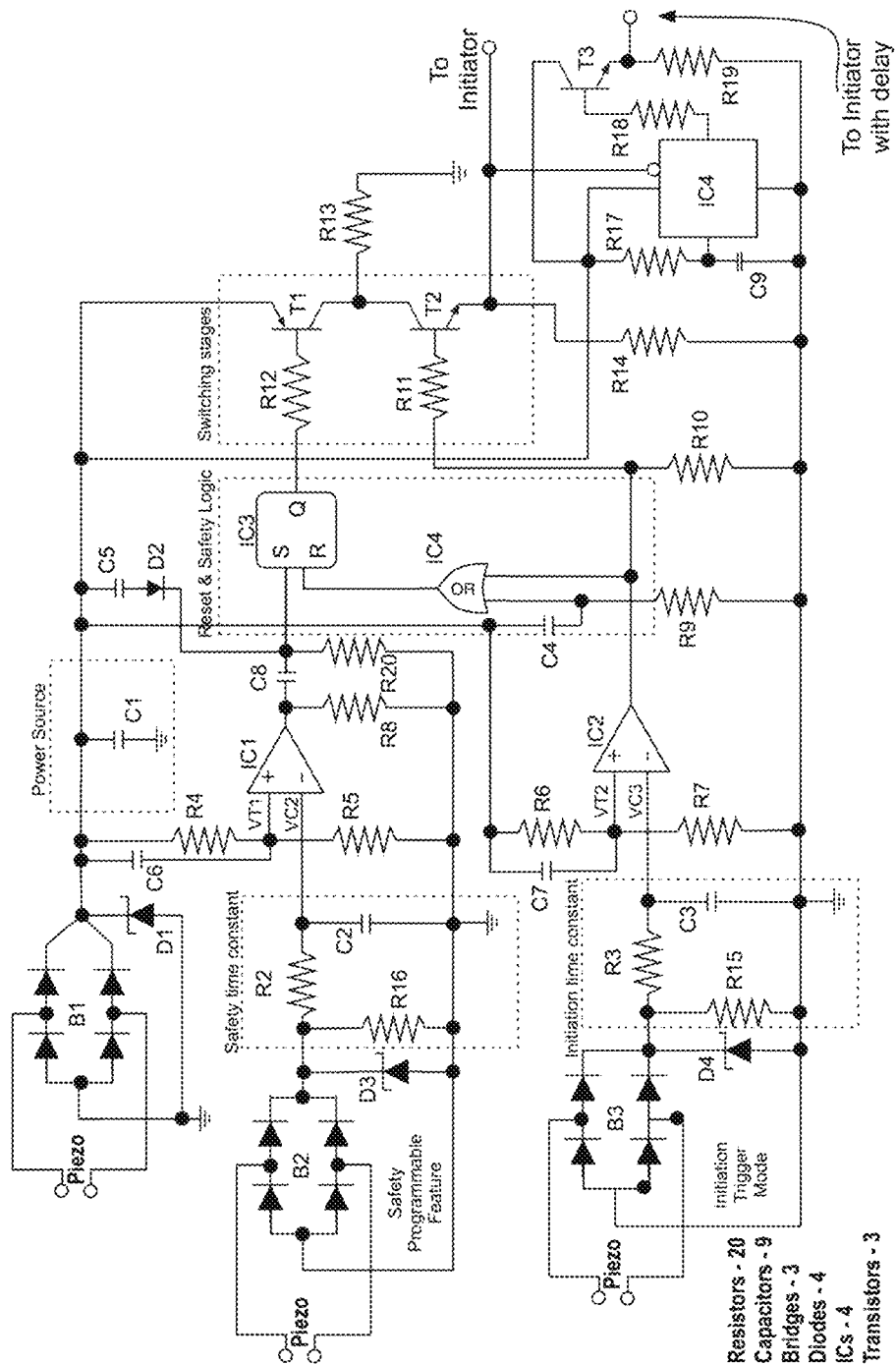
FIG. 4 illustrates an alternative piezoelectric powered programmable event detection and logic circuitry for differentiating all no-fire events from all-fire events and to initiate igniter with a programmed time delay following all-fire event detection.

FIG. 4 shows the diagram of another possible design of the piezoelectric element powered electronics circuitry with programmable initiation time delay feature for use in the disclosed electrically initiated inertial igniters. This design includes an integrated capability to delay the initiation signal by a selected (programmed) amount of time, which could be in seconds and even minutes or more.

In the design shown in FIG. 4, power stored in power supply capacitor C1 is harvested similarly from the at least one piezoelectric element and rectified by the bridge rectifier B1. The voltage at C1 rises to the operational value and it is now ready to start powering the electronics, however, during the transitional state it is very important that the comparator IC1 and IC2, and the OR gate be reset to its desired output value. Capacitors C6 and C7, stabilize and reset IC1 and IC2, respectively, and capacitor C4 resets the IC3, which ensures that switching transistor T1 is ready for operation. A second enhancement of the design shown in FIG. 4 compared to that of the design shown in FIG. 2 is related to the safe operation of the rectified output of the at least one piezoelectric element at the bridge rectifiers output. Diodes D1, D3 and D4 are clamping and transient suppression diodes. These devices ensure that high transient values of voltages produced by the piezoelectric elements do not reach the electronic circuits.

In the event detection and logic circuitry of FIG. 4, a programmable time delay capability to delay the signal to initiate the igniter is also incorporated. In this circuitry design, IC4, the resistor R17 and the capacitor C9 provide the time constant for the output of IC4 at R18 to provide a delayed output to the igniter initiator circuit. The delayed output is determined by the values of R17 and C9. This circuitry obviously offers for both non-delayed as well as delayed output depending on the application. Obviously any other programmable timing device may be used instead.

In certain applications such as medium caliber projectiles, the firing acceleration is very high, for example up to 55,000 Gs and even higher, therefore significantly higher than any accidental accelerations that may be experienced due to dropping. In addition, the volume available for the thermal battery and its igniter is very small.

For such applications, it is preferable that the battery be kept in its inactive state throughout the gun launch and until the acceleration forces resulting from setback and set forward have been significantly abated. For this reason, it is advantageous that initiation of the thermal battery be delayed after launch until the projectile has exited the gun barrel. For such applications, the event detection, safety and ignition electronics and logic and initiation time delay circuitry can be significantly simplified.

Figure 5:
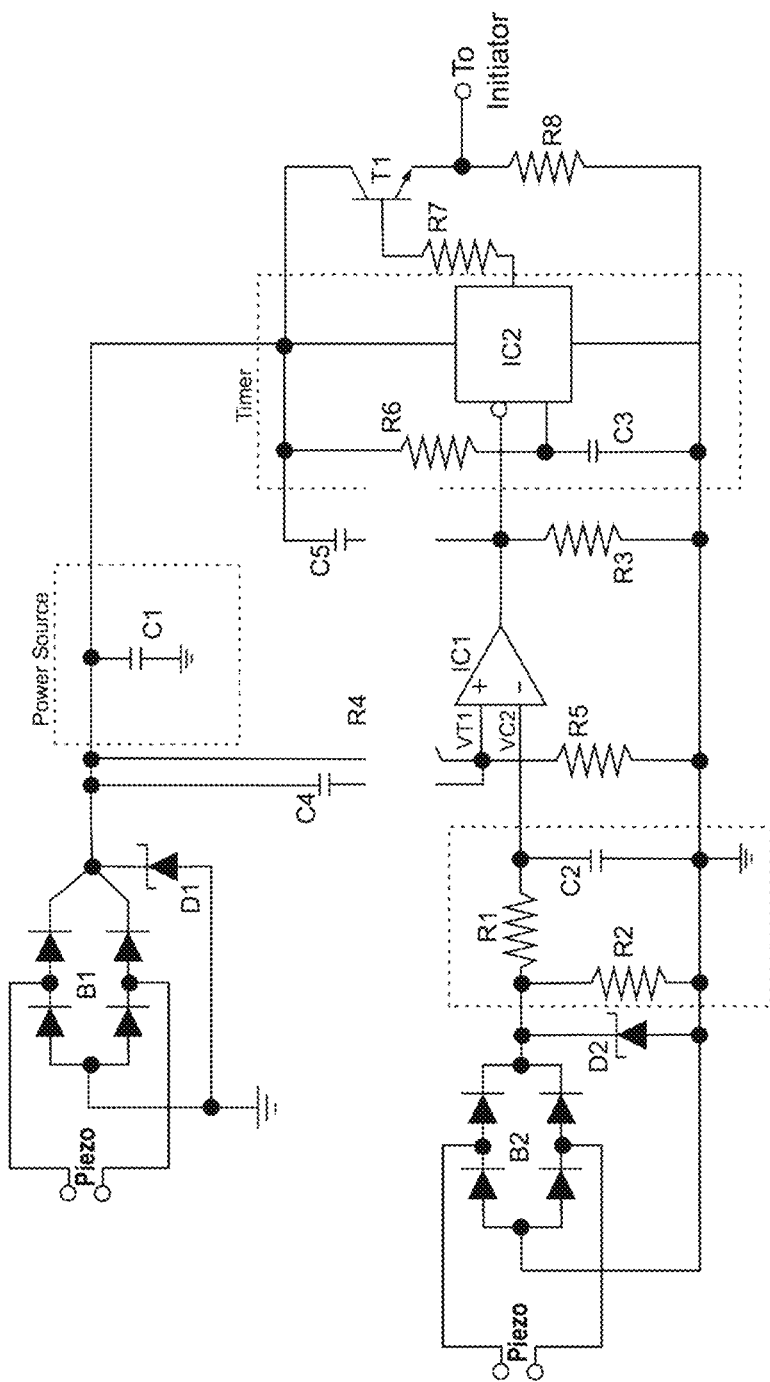

FIG. 5 shows a design of a circuit that will measure the setback acceleration by means of the at least one piezoelectric element. The signal produced by the piezoelectric element due to the setback acceleration is rectified and monitored by IC1 for peak amplitude and duration. These two parameters create a voltage (VC2) which will be compared by IC1. When voltage VC2 becomes higher than voltage VT1, IC1 will output a voltage which will reset IC2. At reset, IC2 will initiate a count of time which will be governed by the value of resistor R6 and capacitor C3. The output of IC2 will be buffered by switching transistor T1 which powers the initiator.

Figure 6:
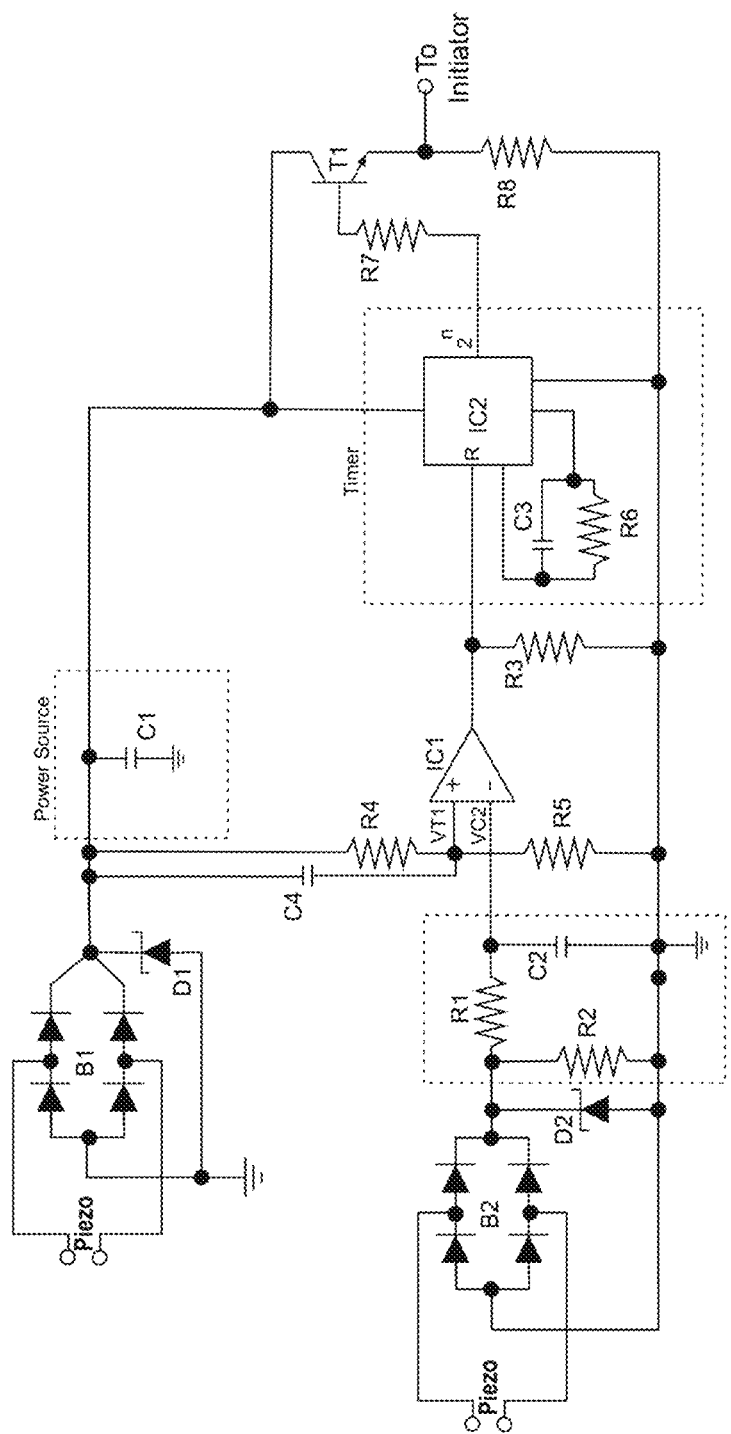
FIG. 6 illustrates a piezoelectric powered programmable event detection and logic circuitry design for event detection and initiation for operation over time periods ranging from minutes to days.

There are also military and civilian applications that require certain sensors be deployed and remain waiting for certain events for relatively long periods of time, ranging from minutes to hours or even days. To accomplish this purpose, a new type of timer will be employed to provide such a dynamic range (minutes to days) as shown in FIG. 6. IC2 can be programmed to deliver delay times from minutes to days by the use of a binary type counter which uses the clock generated by the parallel combination of R6 and C3 and multiplying it by a binary count depending on which output $2^n$ is used.

In the circuitry shown in FIG. 6, the piezoelectric element will detect a launch or impact induced acceleration and/or deceleration, and the signal produced by the launch and/or impact forces will be rectified and detected by R1 and C2. The time constant provided by R1 and C2 will test the signal from the piezoelectric element for duration, and the comparison of the threshold voltage VC2 compared with VT1 will test the signal for amplitude threshold. When the threshold has been detected, IC1 will reset the binary counter IC2 which will start counting time. When the selected time delay has been reached, the output of counter will switch T1, upon which the initiator is powered.

Figure 7:
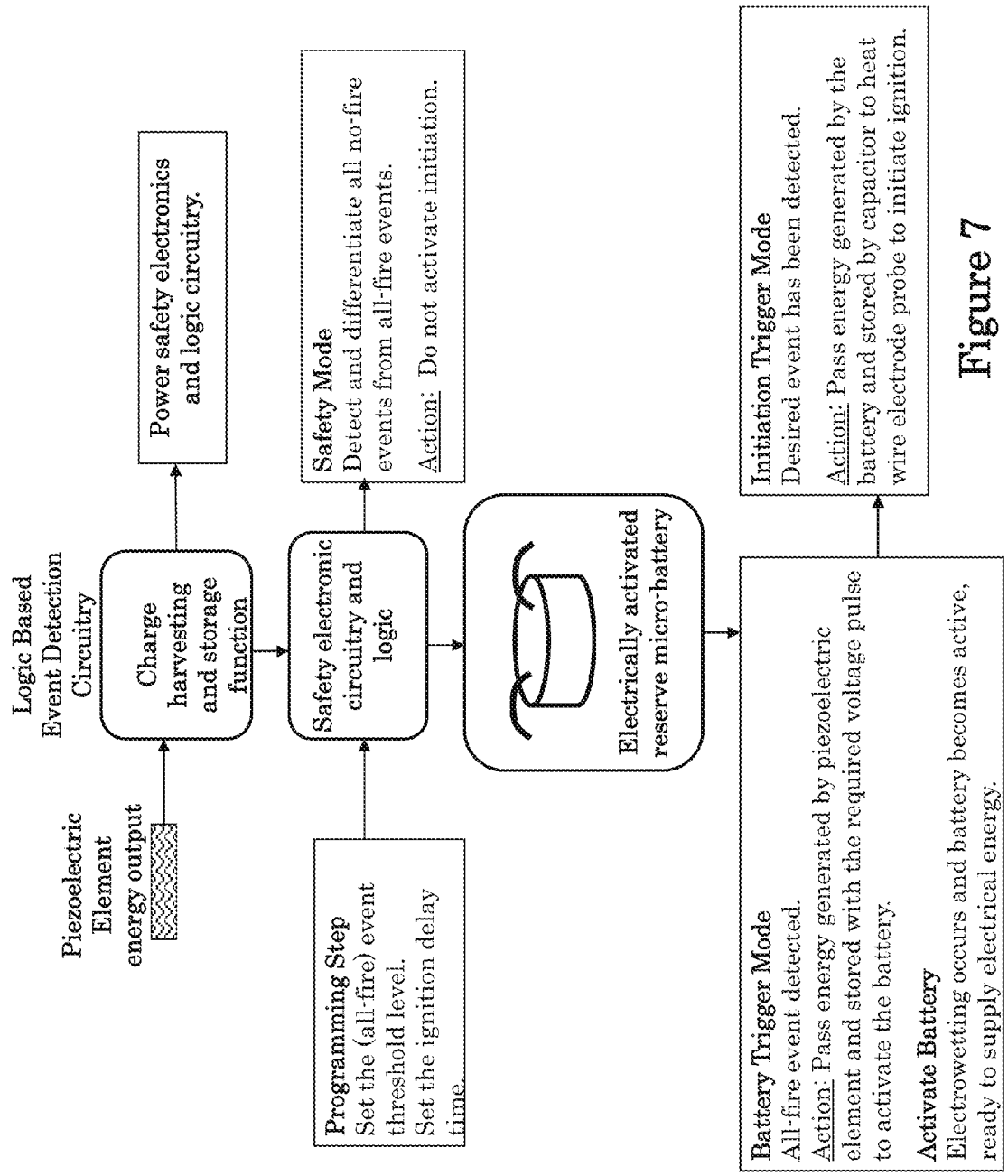
FIG. 7 illustrates the block diagram of the second class of the disclosed piezoelectric element based programmable electrically initiated inertial igniter embodiments employing reserve electrically activated micro-batteries for pyrotechnic initiation.

The block diagram of FIG. 7 shows the general schematics of another embodiment of electrically initiated inertial igniters. In this class of igniters, at least one piezoelectric element is used to generate a charge (electrical energy) in response to the acceleration and/or deceleration profile that it experiences due to all no-fire and all-fire events. The charge generated by the piezoelectric element is then used to power the detection and safety electronics and logic circuitry and possibly partially the detonation capacitor and its activation circuitry, as described later in this disclosure. This class of concepts are similar to the previous class of electrically initiated inertial igniter embodiments shown in FIG. 1, with the main difference being that the electrical energy required to heat the wire electrode probe to initiate ignition of the pyrotechnic paper is provided mainly by a reserve micro-power battery, preferably fabricated on the aforementioned logic-based detection and switching circuitry chip, thereby significantly reducing the amount of power that the at least one piezoelectric element has to produce. In addition, since the energy density of the reserve battery is generally significantly higher than that of the piezoelectric elements, the resulting electrically initiated inertial battery is also expected to be smaller.

In this class of electrically initiated inertial igniter embodiments, essentially the same event detection, safety and ignition initiation electronics and logic circuitry described for the aforementioned first class of electrically initiated inertial igniters shown in FIG. 1 is employed with the exception that the power to initiate the ignition of the pyrotechnics comes mostly from the micro-power battery rather than the piezoelectric generator. As a result, more piezoelectric generated power is available to power the electronics and logic circuitry; thereby it is possible to add more safety features and even active elements to the circuitry. More sophisticated detection schemes and more layers of safety may also become possible to add to the igniter electronics.

One type of reserve micro-power battery that is suitable for the present application is micro-batteries in which the electrode assembly is kept dry and away from the active liquid electrolyte by means of a nano-structured and super-hydrophobic membrane from mPhase Technologies, Inc., 150 Clove Road 11th Floor, Little Falls, N.J. 07424. Then using a phenomenon called electro-wetting the electrolyte can be triggered by a voltage pulse to flow through the membrane and initiate the electrochemical energy generation. Such batteries have been fabricated with different chemistries.

In this class of electrically initiated inertial igniter embodiments, when the aforementioned event detection electronics circuitry and logic (such as those shown in FIGS. 2 and 4-6) detects the all-fire event, the circuit would then switch the required voltage to trigger and activate the reserve micro-power cell. In this concept, the piezoelectric element must only provide enough energy to the capacitor so that the required voltage is generated in the capacitor for activation of the reserve battery. For this purpose and for the aforementioned reserve micro-power cell, the capacitor may have to provide a brief voltage pulse of approximately 50 milliseconds duration of between 30-70 volts. It is important to note that the triggering activation voltages required for electrowetting technique to activate the reserve power cell requires negligible current from the storage capacitor.

The expected size and volume of the class of electrically initiated inertial igniter embodiments shown in the block diagram of FIG. 7 is expected to be less than those for the embodiments constructed based on the block diagram of FIG. 1. This is expected to be the case since a significantly smaller piezoelectric element will be needed for the activation of the aforementioned reserve micro-power battery, which could be of the order of 1 mm$^2$ surface area and integrated onto the logic and switching circuitry. In addition, the capacitor used for triggering the reserve micro-power battery is expected to be significantly smaller than that of the class of igniters shown in the block diagram of FIG. 1. In addition, the power required to activate the reserve micro-power battery is minimal.

In an alternative embodiment of the present invention shown in the block diagram of FIG. 7, an electrically initiated thermal reserve micro-battery is used instead of the aforementioned micro-batteries in which the electrode assembly is kept dry and away from the active liquid electrolyte by means of a nano-structured and super-hydrophobic membrane. The thermal micro-battery can be very small since it has to provide a very small amount of electrical energy which is quickly stored in the device power capacitor (e.g., the capacitor C1 in FIGS. 2, 4-6). In fact, since in general the thermal micro-battery is required to provide a very small amount of electrical energy (usually 5-10 mJ to a maximum of 100-200 mJ of electrical energy), the battery may be constructed with minimal or even no insulation, thereby allowing it to be constructed in even smaller packages.

The use of piezoelectric elements (preferably in stacked configuration) for energy harvesting in gun-fired munitions, mortars and the like is well known in the art, such as at Rastegar, J., Murray, R., Pereira, C., and Nguyen, H-L., "Novel Piezoelectric-Based Energy-Harvesting Power Sources for Gun-Fired Munitions," *SPIE 14th Annual International Symposium on Smart Structures and Materials* 6527-32 (2007); Rastegar, J., Murray, R., Pereira, C., and Nguyen, H-L., "Novel Impact-Based Peak-Energy Locking Piezoelectric Generators for Munitions," *SPIE 14th Annual International Symposium on Smart Structures and Materials* 6527-31 (2007); Rastegar, J., and Murray, R., "Novel Vibration-Based Electrical Energy Generators for Low and Variable Speed Turbo-Machinery," *SPIE 14th Annual International Symposium on Smart Structures and Materials* 6527-33 (2007). Rastegar, J., Pereira, C., and H-L.; Nguyen, "Piezoelectric-Based Power Sources for Harvesting Energy from Platforms with Low Frequency Vibration," *SPIE 13th Annual International Symposium on Smart Structures and Materials* 6171-1 (2006) and U.S. Patent Application Publication No. 2008/0129151 filed on Dec. 3, 2007. In such energy harvesting power sources that use piezoelectric elements, the protection of the piezoelectric element from the harsh firing environment is essential and such methods are fully described in the above provided references.

Figure 8:
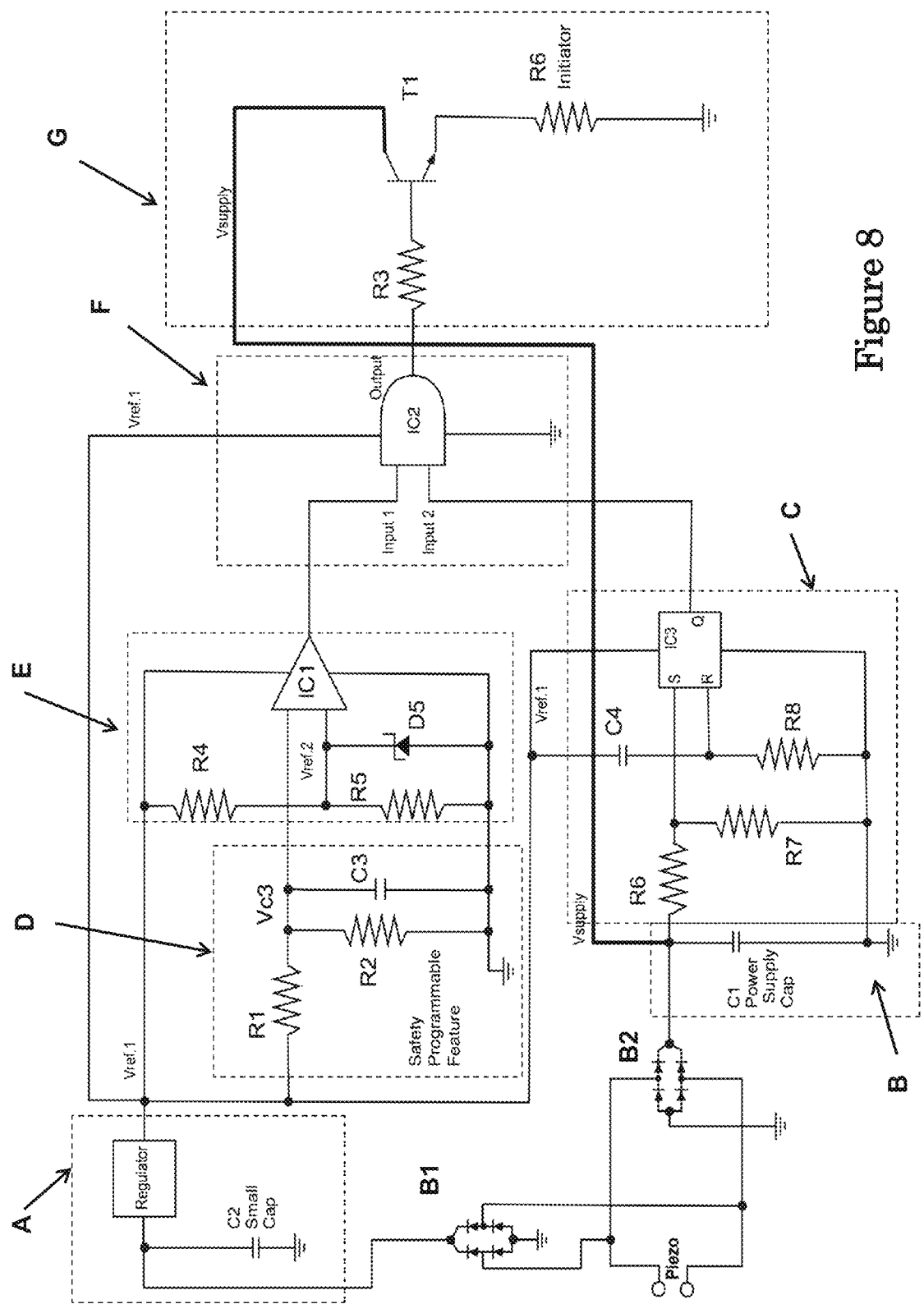
FIG. 8 illustrates an alternative piezoelectric powered programmable event detection and logic circuitry for differentiating all no-fire events from all-fire events and to initiate igniter following all-fire event detection.

Another alternative embodiment of the present invention is shown in the diagram of FIG. 8. In this programmable inertial ignition device embodiment diagram, the circuitry design is divided into functional sections which when interconnected provide reliable methods to prevent unintentional and accidental initiation to achieve the prescribed no-fire and all-fire condition. In the diagram of FIG. 8, each of the aforementioned functional sections (shown in FIG. 8 with dashed rectangles and indicated by capital letters A-G) are described separately as well as how they are interconnected and function as a programmable inertial ignition device. In this embodiment of the programmable inertial ignition device, piezoelectric generators are also used to harvest energy to power the device electronics and logics circuitry as well as power the electrical initiator of the device.

Similar to the embodiments of FIGS. 2 and 4-6, at least one piezoelectric-based generator (indicated as piezo in the diagrams of FIGS. 2, 4-6 as well as 8) is provided. The generated electrical charges can be rectified by the diodes bridges B1 and B2 (only one diode bridge can be used and are shown in the above diagrams for ease of illustration only).

Section A: When the piezoelectric generator is subjected to shock loading such as experienced by setback and/or acceleration and/or is subjected to mechanical vibration, its output is rectified by the diode bridge B1 and a small amount of the generated electrical energy is used to begin to charge a small capacitor [C2]. The voltage across C2 is regulated to a fixed reference voltage [Vref.1]. The regulated voltage [Vref.1] provides power to logic circuits [IC1, IC2, IC3].

Sections B, C, F: The electrical output of the piezoelectric generator also feeds the power supply capacitor C1 (Section B) from diode bridge B2, which will charge much slower than capacitor C2 due to its significantly larger size. The voltage across C1 will not power the initiator until it reaches a controlled value, as follows: IC3 monitors the voltage across C1 by means of resistors R6 and R7 (part of Section C). When the voltage at the (S) input of IC3 reaches approximately 0.7 Vref.1, latch device IC3 output will switch to logic 1. The output of IC3 will provide a logic 1 condition at input 2 of IC2 (Section F). IC3 will always be initialized to a logic zero output when Vref.1 first comes on. The initialization is achieved by a very small burst of electrical energy from Vref.1 being fed to the reset (R) input of IC3 through capacitor C4 and resistor R8. Capacitor C4 charges very quickly and its impedance becomes infinite at full charge, therefore the voltage at the reset (R) pin of IC3 becomes zero in a few micro-seconds. The duration of the reset (R) pulse is directly controlled by C4*R8 (part of Section C).

Sections D, E, F: The safety programmable feature (Section D) functions as previously described for the embodiments of FIGS. 2 and 4-6. In short, it uses the electrical energy generated by the piezoelectric generator to charge the capacitor C3. The capacitor C3 charges at a rate that is controlled by R1*C3. Resistor R2 leaks some of the charge built across C3, so that the voltage across C3 does not build up unless a sustained and high amount of electrical energy is generated by the piezoelectric generator, i.e., a large enough force is applied to the piezoelectric element long enough, as would be the case during the launch acceleration of munitions (corresponding to the all-fire condition). If the voltage across C3 (Vc3) reaches the same value or higher value than the voltage across R5 and D5 (Vref.2), then op-amp IC1 output will reach a logic 1. The diode D5 is a clamping and transient suppression diode. The output of IC1 is directly connected to the input 1 of IC2.

Sections F, G: When both input 1 and input 2 conditions are met (Section F), the output of logic circuit IC2 will provide electrical energy to drive transistor T1 into saturation and therefore transistor T1 will operate as a switch thereby connecting the supply voltage across C1 (V supply) to the initiation device (indicated as resistor R6). Note that switch T1 will not connect "V supply" until it reaches a value of approximately 0.7 Vref. 1.

Figure 9:
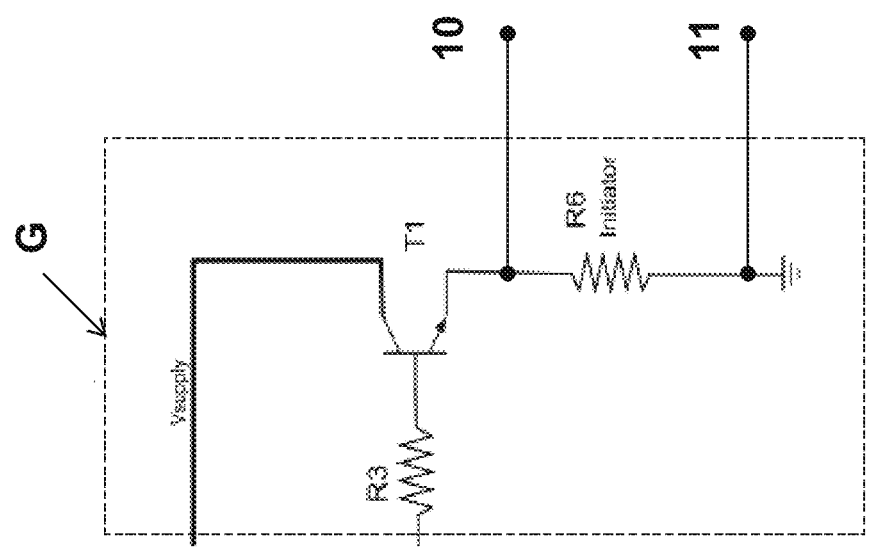
FIG. 9 illustrates the initiator circuitry portion of the piezoelectric element based class of programmable electrically initiated inertial igniter embodiments as modified to provide for detection of the thermal battery or the like activation status.

In the embodiments, the initiator (e.g., indicated as resistor R6 in the embodiment of FIG. 8) was shown to be used. It is noted that during the initiation process, the resistor R6 is heated up to initiate the pyrotechnic material that surrounds it. During this process, the resistor R6 filament or the like is burned, and thereby very low resistance (usually in the order of a few Ohms) measured of the resistor R6 is significantly increased (usually by orders of magnitude) depending on the pyrotechnic material used in the initiator. This change in the resistance of the initiator filament is readily detectable and can be used to determine if the initiator has been activated. For the example of the embodiment of FIG. 8, the resistance of the resistor R6 is readily measured between the terminals 10 and 11 as shown in the schematic of Section G of the FIG. 8 circuitry that is redrawn in FIG. 9.

It is appreciated by those skilled in the art that in certain situations, for example following certain accidents such as dropping of munitions or when subjected to electrostatic discharge or the like or for health monitoring purposes, it is highly desirable for the user to be able to determine if the thermal battery has been activated or not without the need to disassemble the munitions and perform testing such as using x-rays to determine the activation state of the thermal battery. The above embodiment allows the user to interrogate the activation state of the thermal battery to determine if it has been already activated by measuring the resistance level of the initiator. It is noted that even if the thermal battery has been accidentally initiated by means other than the activation of the said initiator (resistor R6 in FIGS. 8 and 9), upon activation of the thermal battery pyrotechnic materials, the initiator resistor would still be burned and the state of the thermal battery activation can still be determined by the measured changes in the initiator electrical resistance.

Figure 10:
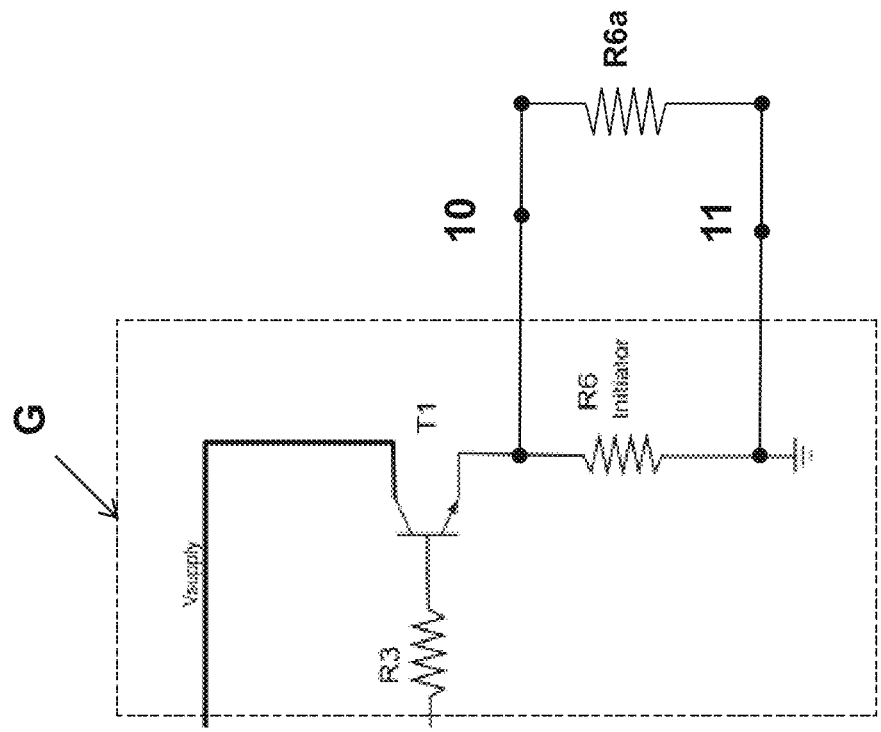
FIG. 10 illustrates the initiator circuitry portion of the piezoelectric element based class of programmable electrically initiated inertial igniter embodiments using at least two initiators to increase thermal battery or the like activation reliability.

It is a common practice in thermal batteries to use a single initiator for thermal battery activation, as was also described in the aforementioned embodiments. However, in certain applications when very high initiation reliability is desired, two or more initiators (e.g., similar to the initiator R6 in FIGS. 8 and 9) may be employed. For example, at least one additional initiator R6a may be provided in parallel with the initiator R6 as shown in the modified schematic of Section G of the circuitry of FIG. 8 as illustrated in the schematic of FIG. 10. With the addition of the least one additional initiator R6a, FIG. 10, by measuring the electrical resistance between the terminals 10 and 11, it is readily determined if at least one of the initiator resistors R6 or R6a has burned, i.e., its electrical resistance has been significantly increased, which indicates if the thermal battery has been activated.

Figure 11:
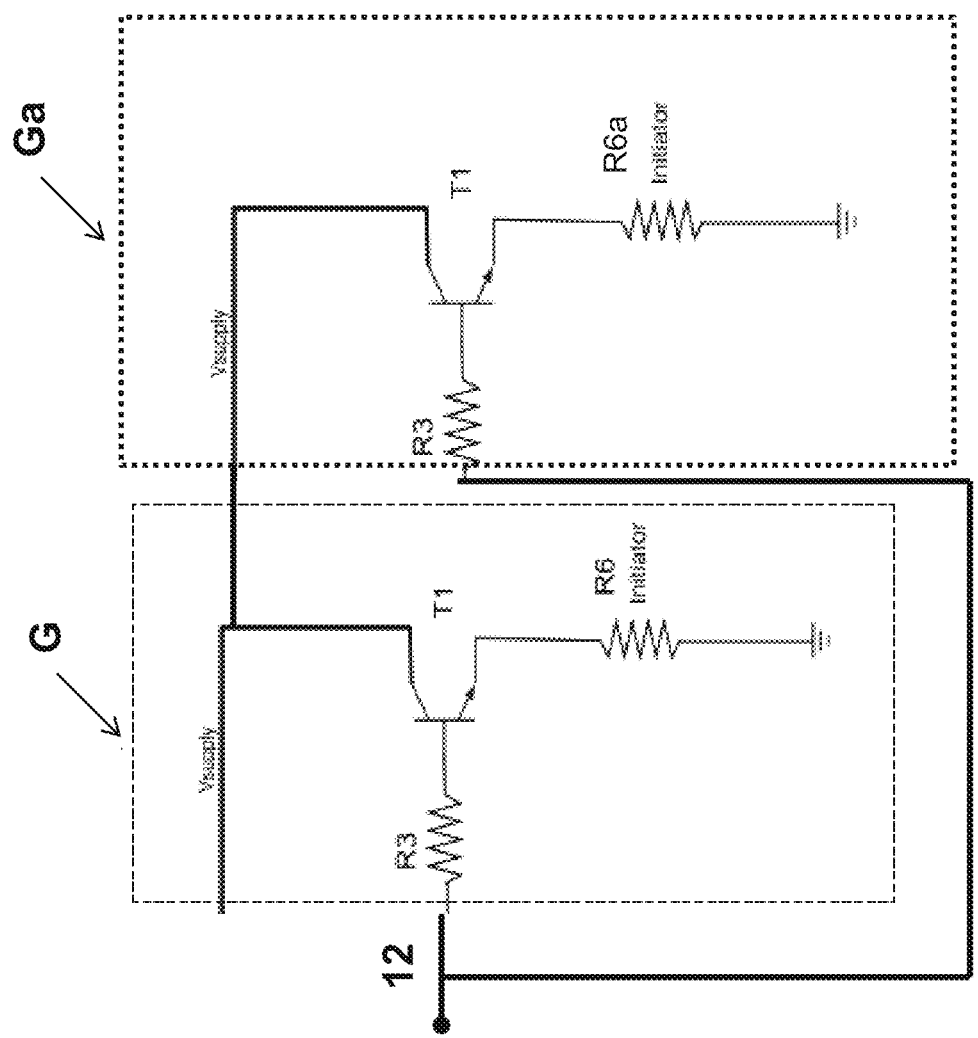
FIG. 11 illustrates the initiator circuitry portion of the piezoelectric element based class of programmable electrically initiated inertial igniter embodiments using at least two initiators with independent circuitry to further increase thermal battery or the like activation reliability.

When more than one initiator is being used to increase thermal battery activation reliability, it is highly desirable to provide the additional initiators with independent circuitry, and when possible, independent sources of power and safety and logics circuitry as described for the embodiments of FIGS. 2, 4-6 and 8. When it is not possible to provide such totally independent power source and circuitry, the at least one additional independent initiator circuitry needs to be powered by the same device power supply capacitor (e.g., the power supply cap C1 of Section B in FIG. 8). For the embodiment of FIG. 8 and with one additional independent initiator circuitry, the resulting Section G circuitry can be modified to that of FIG. 11. In FIG. 11, the aforementioned one additional independent initiator circuitry is indicated as Section Ga, and is shown to be constructed with identical components R3, T1 and initiator R6, but could obviously be constructed with any other appropriate components and circuitry, and is connected to the circuitry of the embodiment of FIG. 8 and its Section G as shown in FIG. 11.

It is appreciated by those skilled in the art that for the latter embodiment shown in the schematic of FIG. 11, the more than one parallel initiator R6 (in the Section G) and R6a (in the at least one Section Ga) may be employed, such as the one shown in FIG. 10.

It is also appreciated by those skilled in the art that the provision of more than one initiator in a thermal battery has many advantages, including the following:

1. By providing more than one initiator, particularly if it has independent circuitry and when possible a totally independent initiation unit with its own power source and safety and initiation circuitry, the thermal batter activation reliability is significantly increased.
2. With more than one initiator, the initiators can be distributed in the thermal battery to ignite the thermal battery pyrotechnic materials at more than one location. This capability provides the means of achieving several objectives. Firstly, since the thermal battery rise time (the time that it takes for the battery to become functional following initial initiator activation) is dependent on the time that it takes for the thermal battery pyrotechnic (heat generating components) to burn and melt the solid electrolyte, by igniting the thermal battery pyrotechnic materials at more than one location, the total time that it takes for the pyrotechnic material to be burned is significantly reduced. As a result, the thermal battery becomes fully functional faster, i.e., the thermal battery rise time is significantly reduced. Fast rise time is a highly desirable characteristic in certain munitions, e.g., when the thermal battery power is required a very short time following firing. Secondly, by distributing multiple initiators in the thermal battery, a more uniform pattern of pyrotechnic material burn is achieved in the thermal battery and, thereby avoiding non-uniform heating and later cooling of the solid electrolyte, thereby achieving a better thermal battery performance.

In the aforementioned embodiments, active material based elements such as piezoelectric elements (FIGS. 1-2 and 4-8) can be used to generate electrical energy by harvesting electrical energy from the firing acceleration. It is, however, appreciated by those skilled in the art that other types of electrical generators such as coil and permanent magnet type generators may also be used for this purpose. Such coil and permanent magnet type electrical generators may be constructed to undergo linear or rotary or a combined linear and rotary motion, including a vibratory type of linear and rotary motions. In either case, the linear or rotary motion, including of vibratory type, are caused or initiated by the firing event of the munitions in which the thermal battery or the like equipped with such devices are mounted. As an example, coil and permanent magnet type generators that are designed to occupy relatively small volumes and generate electrical energy as a result of firing setback and/or set-forward accelerations and some even as a result of flight vibration and oscillatory motions are provided below.

Figure 12:
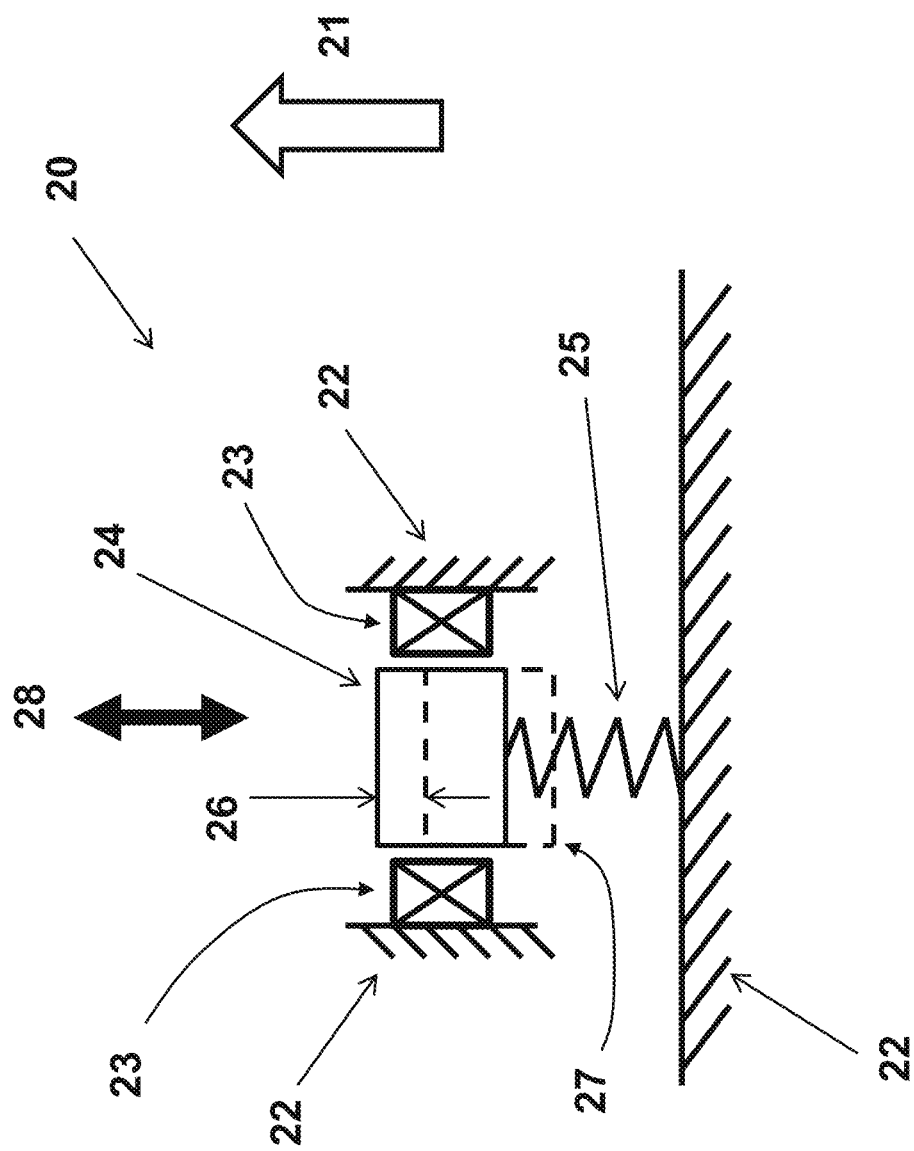
FIG. 12 illustrates a permanent magnet and coil type electrical power generator alternative to the piezoelectric element based power source used in the class of programmable electrically initiated inertial igniter embodiments of FIGS. 1-2 and 4-8.

In one embodiment of the present invention, a magnet and coil generator 20 that forms a vibrating mass-spring system shown in the schematic of FIG. 12 is used to generate electrical energy as a result of firing acceleration in the direction of the arrow 21. The magnet and coil generator 20 is attached to the structure 22 of the device (generally the structure of the initiator), and consists of a coil 23 and magnet 24 elements, with the magnet 24 element (constructed with at least one permanent magnet) is preferably used to function as a mass element that together with the spring element 25 form a vibrating mass-spring unit, that is attached to the structure 22 of the initiator device. Then as the munitions using any one of the initiator embodiments of the present invention shown in FIGS. 1-2 and 4-8 is fired, the firing setback acceleration acts on the mass (magnet portion) 24 of the generator 20, causing the spring element 25 to be deflected a distance indicated by 26, bringing the mass to the position 27, as indicated by dashed lines in FIG. 12. As the munition accelerates, such as after the munition exits the barrel, the said mass-spring unit (elements 25 and 26, respectively) will begin to vibrate up and down in the direction shown by the arrows 28, and the generator will generate electrical energy as is well known in the art. It is noted that in general the firing set-forward acceleration and vibration of the munitions during the flight would also cause vibration of the said generator mass-spring unit, thereby cause the generator 20 to generate more electrical energy. The spring element 25 is preferably made with at least 3 helical strands to minimize the tendency of the mass-spring element to displace laterally or bend to the side during longitudinal displacement and vibration in the direction of the arrow 21.

It is appreciated by those skilled in the art that since electrical energy is generated in the coils 23, the vibrating component of such magnet and coil generators can be the permanent magnet(s) 24 of the magnet and coil generator 20. As a result, the generator output wires are fixed to the structure 22 of the device and the chances of them breaking is minimized.

In another embodiment, the spring element 25 is preloaded and the permanent magnet(s) 24 (mass element) of the mass-spring unit of the magnet and coil generator 20 is locked in its displaced position 27 shown by dashed lines in FIG. 12 by at least one locking element that is provided to lock the spring 25 in its compressed (preloaded) configuration. Then during firing of the projectile, the munitions structure to which the present device magnet and coil generator 20 is rigidly attached is accelerated in the direction of the arrow 21, causing the aforementioned at least one locking element to release permanent magnet(s) 24 (mass element) of the mass-spring unit of the magnet and coil generator 20. Once the permanent magnet(s) 24 (mass element) of the mass-spring unit of the magnet and coil generator 20 is released, the mechanical potential energy stored in the spring 25, i.e., the mechanical potential energy stored in the "mechanical reserve power sources" 20, is released. The released mechanical potential energy will then cause the mass-spring unit) to vibrate, thereby causing the magnet and coil generator 20 to generate electrical energy. Such locking elements for locking preloaded mass-spring units (here, for the permanent magnet(s) 24, i.e., the mass element, of the mass-spring unit of the magnet and coil generator 20) that lock preloaded linearly or rotationally or flexural vibrating units and that are released due to axial acceleration (setback or set-forward acceleration in munitions), or rotational (spin) accelerations or spin rate (due to centrifugal force) are fully described in the U.S. Pat. No. 8,183,746, the entire contents of which is incorporated herein by reference.

Figure 13:
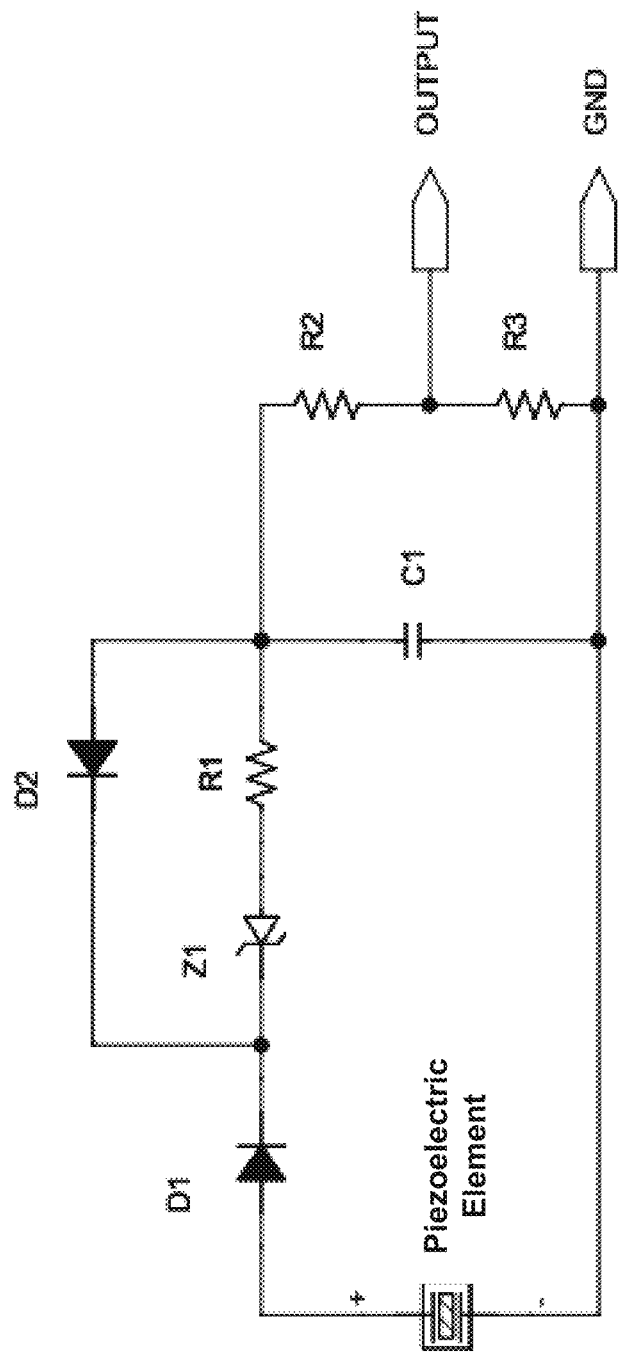
FIG. 13 illustrates an alternative embodiment of the programmable safety and all-fire detection circuitry.

In another alternative embodiment, the aforementioned safety and all-fire detection circuitry (such as the "safety programmable feature" of FIG. 8 and marked "D") is provided with additional beneficial features herein being described. In this embodiment, the general circuitry of the safety and all-fire detection is as shown in FIG. 13. The circuitry is considered to be passive since it does not require any external source of power or batteries or other similar sources of chemical or externally charged power sources for its operation. In a manner similar to those described for the previous safety and all-fire detection circuitry, the firing setback or other shock loading and/or vibrations of the device in which the present circuitry is used would induce charges in the piezoelectric (preferably stack) element. The present circuitry is designed to differentiate firing setback induced shock (high-G accelerations with relatively long duration) from all other no-fire accelerations such as high-G but short duration pulse(s), relatively low peak G but long term vibration loading such as experienced during transportation and the like.

In the safety and all-fire detection circuitry of FIG. 13, electrical energy (charge) is provided by at least one piezoelectric (preferably stack) element. All-fire setback condition is detected by the voltage level of the capacitor C1 while the circuitry prevents the charging of the capacitor C1 to the prescribed voltage level if the generated piezoelectric charges are due to the aforementioned no-fire conditions as described below.

In the safety and all-fire detection circuitry embodiment of FIG. 13, the diode D1 (preferably a Schottky or a similar diode with a low forward voltage drop and a very fast switching action is used as a rectifier. The indicated feature of the diode D1 reduces energy loss in the circuitry. The indicated diode D1 also has a high backward leakage, which is used as a safety feature in the present embodiment for discharging collected charges in the capacitor C1 when the voltage of the piezoelectric element drops below the prescribed all-fire voltage level.

After rectified, the current due to the charges generated by the piezoelectric element passes through diode Z1 (preferably a Zener or a similar diode) and resistor R1 to charge the capacitor C1 and also pass through resistors R2 and R3 to the ground. During this time, the diode D2 is under reverse bias, thereby passing a very small amount of current. The voltage on the capacitor C1 indicates the amount of energy generated by the piezoelectric element due to its (shock or vibration) loading, less the amount of energy drainage through the resistors R2 and R3 and the losses in the diode Z1 and smaller amounts in the remaining circuit elements. The resistors R2 and R3 also act as a programmable divider that can be used to adjust the output voltage level corresponding to the all-fire condition as demanded by the device/circuitry at the circuitry output shown in FIG. 13. It is also noted that the output and ground can also be used as a differential output.

When a device using the circuitry shown in FIG. 13 is subjected to a relatively short duration shock loading such as due to accidental dropping, the piezoelectric element would generate relatively high voltage pulses with very short duration. The generated voltages may even be higher than the voltage level that are generated as the device is subjected to the prescribed all-fire setback acceleration, but the duration of such pulses is significantly shorter than those of the all-fire setback acceleration pulse. For example, an all-fire acceleration may be around 900 G with 10 msec of duration while an accidental drop may cause a shock loading of up to 2,000 G but for a very short duration of less than 0.5 msec. In the present circuitry embodiment, the capacitor C1 and the resistor R1 are sized such that the resulting charging time constant (R1C1) for the capacitor C1 is significantly longer than such "high voltage and short duration" pulses, thereby ensuring that the capacitor C1 is not charged to the aforementioned "all-fire voltage level" due to any no-fire shock loading event. In addition, to ensure that the charges due to several such "high voltage and short duration" pulses do not accumulate in the capacitor C1 and provide a false "all-fire voltage level" indication, the diode D2 is provided to discharge all accumulated charges in the capacitor C1 once the piezoelectric voltage drops below the voltage level on C1.

In certain application, however, when the piezoelectric voltage drops, the amount of discharge through the diode D2 is desired to be limited to a drop of the capacitor C1 voltage to certain threshold. The said voltage threshold may be desired, for example, for allowing the voltage at the circuitry OUTPUT not to drop below certain limit. As an example and without intending to indicate any limitation on the use of other components and circuitry to perform the same functionality, such a goal can be readily achieved by the addition of a Zener diode Z2 between the diodes D1 and D2 as shown in the alternative "safety and all-fire detection circuitry" embodiment of FIG. 19. As a result, piezoelectric voltage drops, the charges accumulated in the capacitor C1 is discharged through the diode D2, but only to the breakdown voltage level of the Zener diode Z2 instead of dropping to essentially the voltage level of the piezoelectric element.

Figure 19:
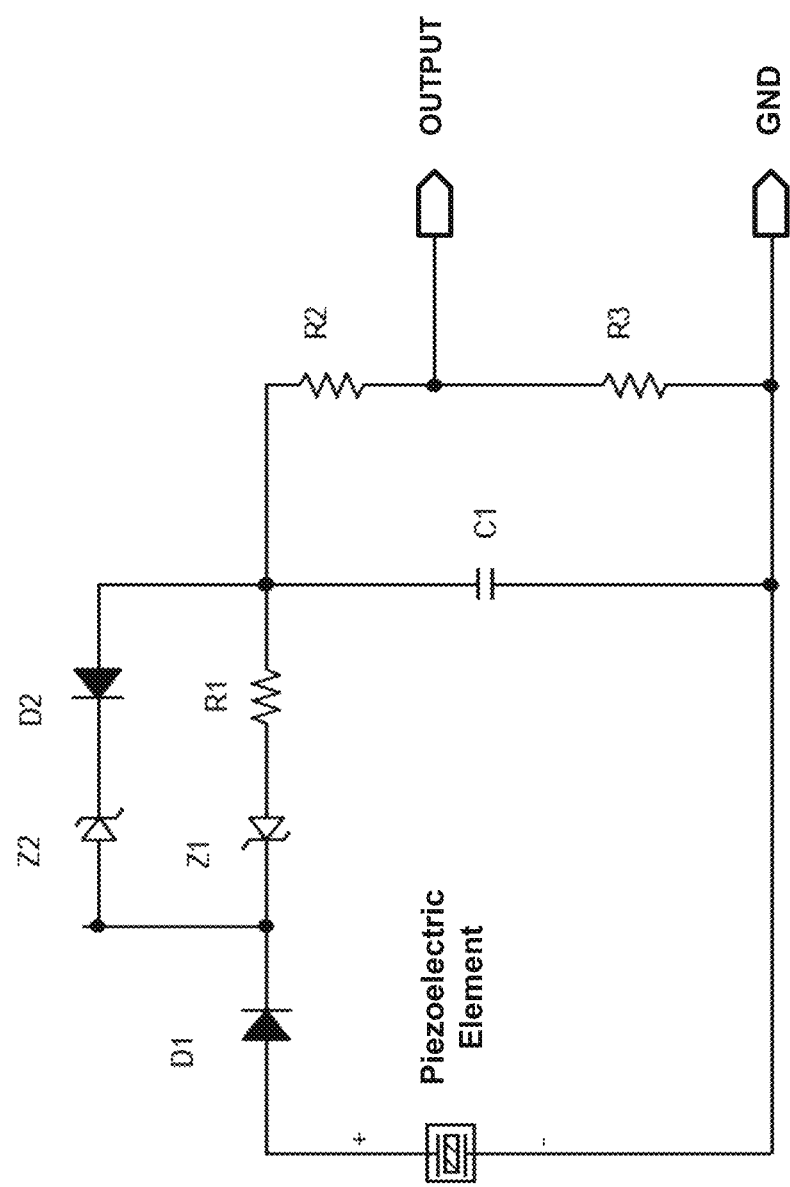
FIG. 19 illustrates an alternative embodiment of the programmable safety and all-fire detection circuitry of the embodiment of FIG. 13.
Figure 19A:
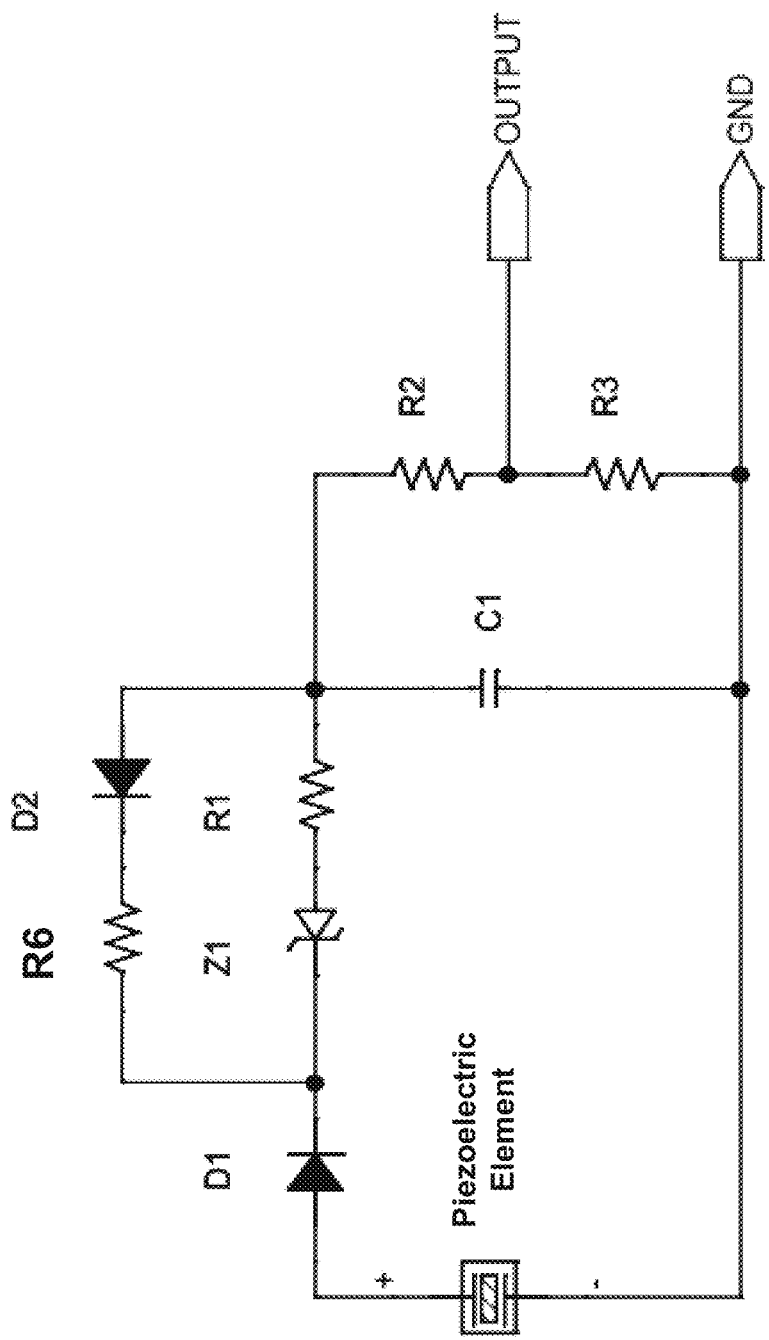
FIG. 19A illustrates an alternative embodiment of the programmable safety and all-fire detection circuitry of the embodiment of FIG. 19.

In addition, in both the circuits of FIGS. 13 and 19, when the diode D2 is under reverse bias, it passes a very small amount of current. If in certain applications the amount of this current is needed to be reduced, this can be readily accomplished by the addition of the serial resistor R6 as shown in the schematic of FIG. 19A. Then in the resulting circuit, when the diode D2 is under forward bias, the resistor R6 would control the time that it would take for the charges collected on the capacitor C1 to be discharged back to the piezoelectric element.

It is noted that leaking through resistors R2 and R3 is also used to lengthen the amount of time that is needed for the piezoelectric element to charge the capacitor C1. This capability provides a simple tool to readily adjust ("program") the device to the desired "all-fire" condition. The said leakage through resistors R2 and R3 would also provide additional means of ensuring that the aforementioned high voltage and short duration pulses do not accumulate charge in the capacitor C1 to trigger a false all-fire detection signal.

It is also noted that vibration loading (usually with peak G loadings that are usually significantly lower than those of accidental drops or the like) for long periods of time such as those experienced during transportation or other similar conditions, even if they are accompanied with aforementioned higher G but short duration shock loading pulses are similarly rejected by the Zener diode Z1 and the leaking resistors R2 and R3. The breakdown voltage of the Zener diode Z1 is generally selected depending on the selected all-fire indicating voltage of the capacitor C1.

The piezoelectric element powered safety and all-fire detection circuitry shown in FIGS. 13, 19 and 19A provide a voltage at the indicated output that can be monitored by the user device/circuitry to detect no-fire condition based on the prescribed ("programmed") all-fire setback acceleration condition. In the following, the method of using the safety and all-fire detection circuitry embodiment of FIG. 13 or FIG. 19 or 19A to design passive initiators for igniting pyrotechnic material or the like is described. Examples of other applications for munitions all-fire condition detection and other commercial and industrial applications in which a prescribed shock or vibration loading is to be safely detected are described later in this disclosure.

A method of using the safety and all-fire detection circuitry embodiment of FIG. 13 (or similarly the safety and all-fire detection circuitry embodiment of FIG. 19 or 19A) to design passive initiators for pyrotechnic material or the like is herein described and examples of its implementation are provided. The safety and all-fire detection circuitry of the embodiment of FIG. 13 is redrawn in FIG. 14. In the present method, the circuit output is connected to the indicated "output voltage threshold detection and switching element", which is designed to detect when the output voltage threshold corresponding to the prescribed all-fire condition has been reached. When the said all-fire voltage threshold is detected, the "output voltage threshold detection and switching element" would then close the indicated circuit and allow direct flow of current from the piezoelectric element through the indicated "initiator bridge wire" to the ground. The initiator bridge wires currently used are very low resistance (commonly around 1-3 Ohm) bridge wires that are heated by the passing current, which would then usually ignite certain (usually primary) pyrotechnic material. Initiator bridge wires of different types such as those made out of ultra-thin wires or wires printed/deposited/etched on certain substrate or semi-conductor type such as those fabricated using semi-conductor manufacturing processes are commonly used in electrical initiators and could be used in the present embodiment.

The "output voltage threshold detection and switching element" may be designed in a number of ways and with and without external power. In the munitions applications, however, one of the main objectives is safety, i.e., total or nearly total elimination of the chances that initiation could occur in the absence of all-fire detection. The other objectives in munitions application include passive circuitry, i.e., the initiator circuitry not requiring external power; and miniaturization, which requires very low power circuitry that can be powered with very small piezoelectric elements. The following embodiments are examples of passive electrical initiators for pyrotechnic material or the like constructed with the safety and all-fire detection circuitry embodiment of FIG. 13.

The method of using the safety and all-fire detection circuitry embodiment of FIG. 13 to design passive initiators for pyrotechnic material or the like is herein described and examples of its implementation are provided. The safety and all-fire detection circuitry of the embodiment of FIG. 13 is redrawn in FIG. 14. In the present method, the circuit output is connected to the indicated "output voltage threshold detection and switching element", which is designed to detect when the output voltage threshold corresponding to the prescribed all-fire condition has been reached. When the said all-fire voltage threshold is detected, the "output voltage threshold detection and switching element" would then close the indicated circuit and allow direct flow of current from the piezoelectric element through the indicated "initiator bridge wire" to the ground. The initiator bridge wires currently used are very low resistance (commonly around 1-3 Ohm) bridge wires that are heated by the passing current, which would then usually ignite certain (usually primary) pyrotechnic material. Initiator bridge wires of different types such as those made out of ultra-thin wires or wires printed/deposited/etched on certain substrate or semi-conductor type those fabricated using semi-conductor manufacturing processes are commonly used in electrical initiators and could be used in the present embodiment.

Figure 14:
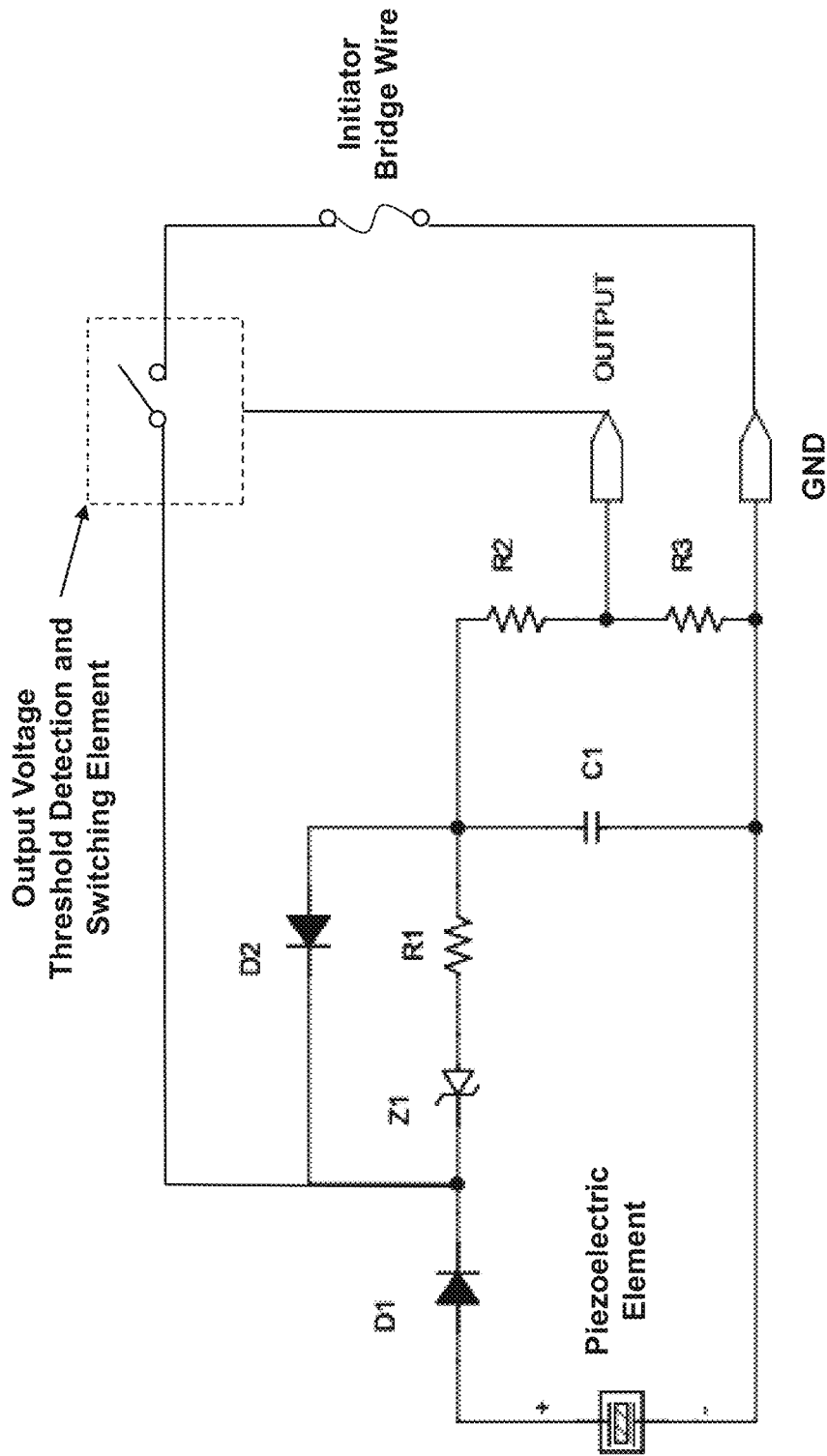

As was previously indicated, for most munitions and other similar applications, the "output voltage threshold detection and switching element" of the embodiment of FIG. 14 is to be designed with a very high level of safety, i.e., for total or nearly total elimination of the chances that initiation occurs in the absence of all-fire condition. Other important objectives in munitions and other similar applications include passive circuitry, i.e., the initiator circuitry not requiring external power; and miniaturization capability, which requires very low power circuitry that can be powered with very small piezoelectric elements. The following two basic embodiments are examples of the implementation of the embodiment of FIG. 14 for such passive electrical initiators for pyrotechnic material or the like that are constructed with the safety and all-fire detection circuitry embodiment of FIG. 13.

Figure 15:
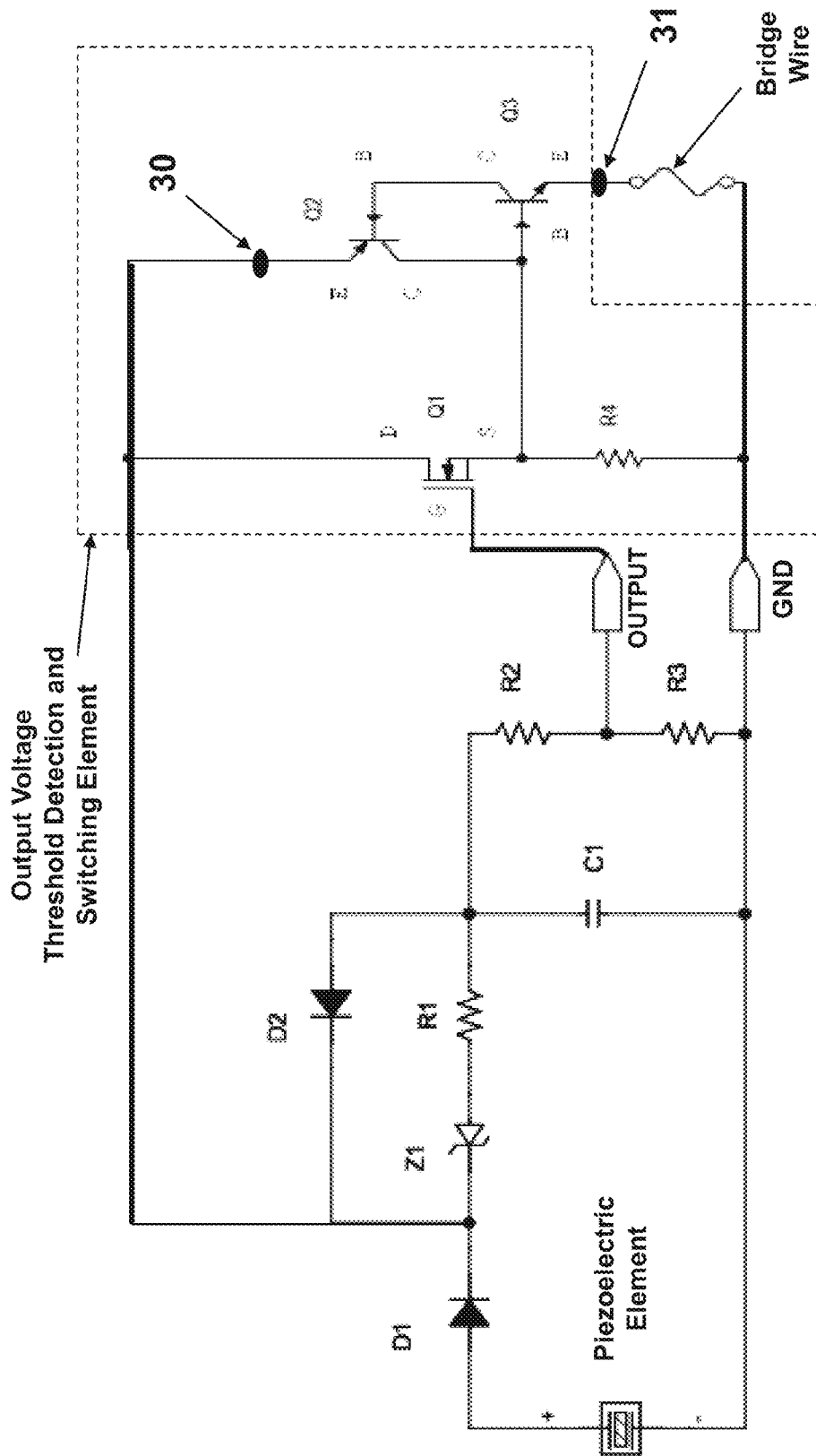
FIG. 15 illustrates the first embodiment of the passive initiators for pyrotechnic material or the like that is particularly suitable for munitions and other similar applications.

The first embodiment of the passive initiators for pyrotechnic material or the like with the above safety and low power characteristics which makes it particularly suitable for munitions and other similar initiator applications is shown in FIG. 15. In this embodiment, the safety and all-fire detection circuitry embodiment of FIG. 13 is provided with the "output voltage threshold detection and switching element" described for the embodiment of FIG. 14 designed with the circuitry shown inside the box with dashed lines. As can be seen in the "output voltage threshold detection and switching element" shown in FIG. 15, by appropriately selecting the component parameters of the circuitry, when the voltage at the OUTPUT of the safety and all-fire detection circuitry (FIGS. 13 and 15) reaches the prescribed all-fire threshold, the N-MOS (indicated as Q1 in FIG. 15) is switched on. During this switching-on process, the voltage on the resistor R4 increases and produces a current $I_{BE}$ on NPN transistor (indicated as Q3 in FIG. 15), in the direction of the arrow at B). The NPN transistor Q3 amplifies the current and introduces current $I_{BE}$ on PNP transistor Q2, while the PNP transistor Q2 amplifies the said current and sends it back to the NPN transistor Q3. This positive feedback configuration of the two transistors Q2 and Q3 at certain saturates the two transistors, making them act as a "switch" that has been closed between the points 30 and 31 in the circuit of FIG. 15, thereby allowing the charges generated by the piezoelectric element to be discharged through the indicated "bridge wire" to the ground (GND). The very low resistance initiator bridge wire is then heated by the passing current, which would then ignite the provided (usually primary) pyrotechnic material.

It is appreciated by those skilled in the art that when the transistors Q2 and Q3 saturate, the closed circuit between the points 30 and 31 stay closed since the positive feedback between the transistors Q2 and Q3 maintains the discharging current loop from the piezoelectric element through the bridge wire to the ground. This is an important feature of the current embodiment since the safety and the "safety and all-fire detection circuitry" portion (embodiment of FIG. 13) of the passive initiators embodiment of FIG. 15 is also powered by the device piezoelectric element, which means the detected all-fire signal voltage (at the indicated OUTPUT) will drop instantly as the transistors Q2 and Q3 saturate and the circuit ("switch") between the points 30 and 31 is closed and the piezoelectric element charges begin to discharge through the "bridge wire" to the ground. It is appreciated by those skilled in the art that if the current to be passed through the "bridge wire" would have been routed through the indicated OUTPUT of the "safety and all-fire detection circuitry" portion of the device, the said drop of the voltage at the OUTPUT point below the all-fire threshold level would have again suddenly blocked the current from reaching the "bridge wire" by reverting the "safety and all-fire detection circuitry" portion back to its no-fire state.

It is appreciated by those skilled in the art that in the circuitry of FIG. 15, the resistance of the resistor R4 determines the input impedance of the bridge wire initiator circuitry. The resistor R4 resistance level is very important for reducing the sensitivity of the positive feedback against noise such as electromagenetic interferece (EMI) and electromagnetic pulse (EMP) and the like. In a slightly modified circuitry, RC filters may be added between Q2 and Q3 to control the gain of positive feedback.

Figure 16:
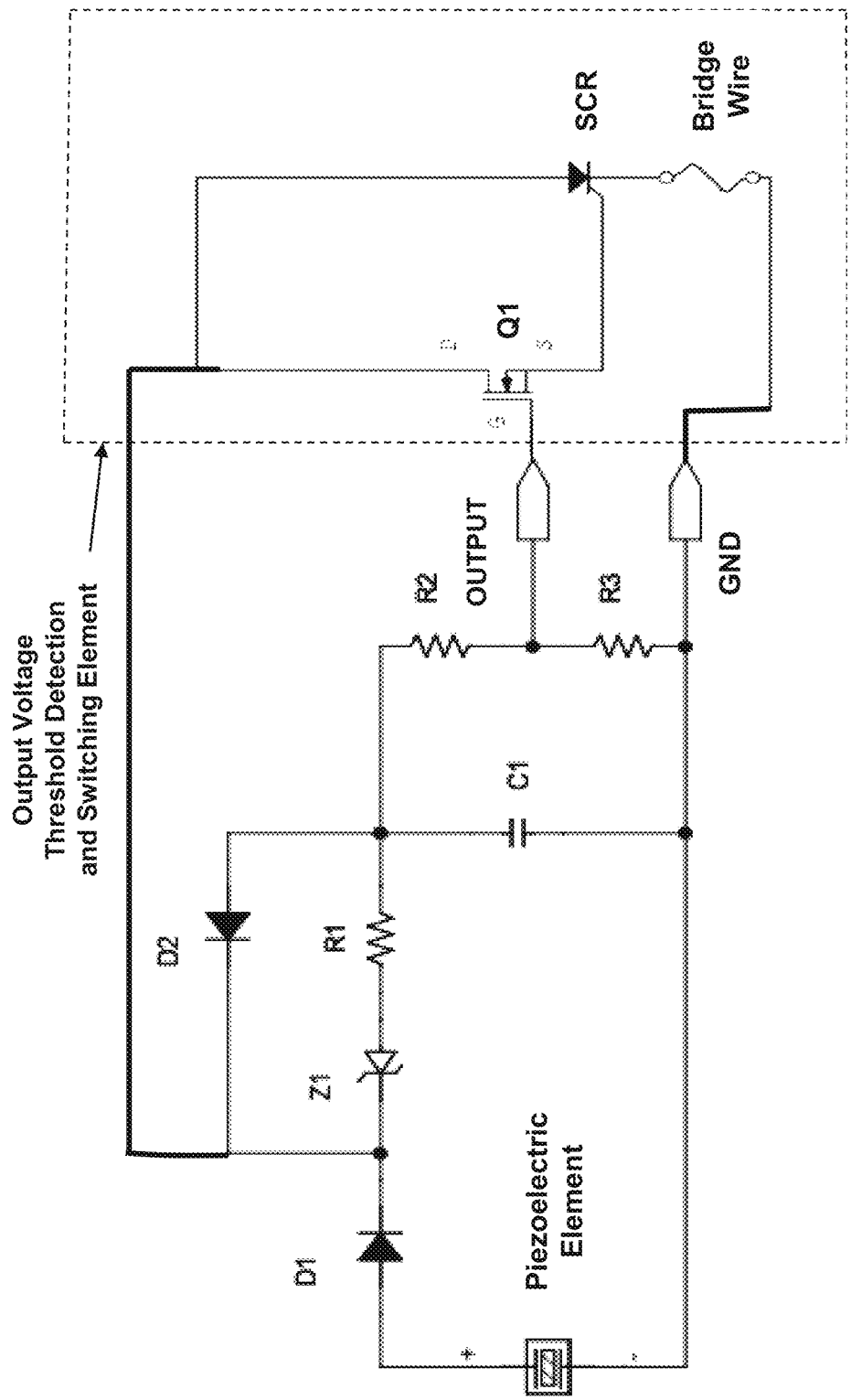
FIG. 16 illustrates the second embodiment of the passive initiators for pyrotechnic material or the like that is particularly suitable for munitions and other similar applications.

In a second embodiment of the passive initiators for pyrotechnic material or the like with the above safety and low power characteristics, when the noise due to sources such as electromagenetic interferece (EMI) and electromagnetic pulse (EMP) and other internal and external sources is either very low or has been taken care of using appropriate shielding and filtering, then a Silicon Controlled Rectifier (SCR) may be used in place of the two transistors Q2 and Q3 in the embodiment of FIG. 14 as shown in the circuitry of FIG. 16. The SCR is a switch driven by gate current and would stay enabled while a current is being passed through it.

Then as was described for the embodiment of FIG. 15, by appropriately selecting the component parameters of the "output voltage threshold detection and switching element" portion of the circuitry shown in FIG. 16, when the voltage at the OUTPUT of the safety and all-fire detection circuitry (FIGS. 13 and 16) reaches the prescribed all-fire threshold, the N-MOS (indicated as Q1 in FIGS. 15 and 16) is switched on. When the N-MOS (Q1) is switched on, the SCR receives enough gate current $I_G$ and becomes a path to release all the charges from the piezoelectric element through the bridge wire to the ground (GND). The SCR will stay enabled until essentially all charges from the piezoelectric element are discharged and the aforementioned current $I_G$ is diminished. As a result, the flow of charges from the piezoelectric element through the bridge wire cannot be interrupted. The very low resistance initiator bridge wire is then heated by the passing current, which would then ignite the provided (usually primary) pyrotechnic material.

As was previously indicated, the piezoelectric element powered safety and all-fire detection circuitry shown in FIG. 13 provides a voltage at the indicated output that can be monitored by the user device/circuitry to detect no-fire condition based on the prescribed ("programmed") all-fire setback acceleration condition. The method of using the all-fire detection circuitry embodiment of FIG. 13 to design passive initiators for igniting pyrotechnic material or the like and a number of its practical implementation embodiments that are particularly suitable for munitions applications were disclosed above. In the following, the method of using the safety and all-fire detection circuitry embodiment of FIG. 13 to design "passive all-fire detection sensors" that would output a signal indicating that a prescribed all-fire condition or other similar events such as lower level impact or shock or sudden jerk or outset of vibration or the like has been detected is described. As previously indicated, these devices differentiate no-fire conditions such as accidental drops which can induce high G levels with short durations and transportation related shock and vibration loadings. The output signal could be of many different types, a few of which are described below, but other types appropriate for matching a user need, for example a flag, a switch and hold or the like, can generally be accommodated. The present devices are considered to be passive since they do not require external power sources for their operation. In the present devices, the sensory information as well as electrical energy to power the electronic circuitry is provided by an appropriately sized piezoelectric element(s).

The safety and all-fire detection circuitry shown in FIG. 13 may be used directly to provide a voltage output that can be monitored by the user device/circuitry to detect all-fire condition based on the prescribed all-fire setback acceleration and the selected circuit elements. It is noted that in general, the circuit elements are selected to minimize the power consumption and thereby minimize the size of the piezoelectric assembly. For the same reason, the voltage monitoring device is also desired to have very high impedance.

The safety and all-fire detection circuitry shown in FIG. 13 may also be used with other added logic circuitry and elements to provide the desired sensory information or sensory based actions such as the initiation described for the embodiments of FIGS. 14-16 and other purposes such as to provide a signal flag; provide multiple signal flags when different levels of firing setback accelerations are detected; or activate a switching device; or initiate the process of storing electrical energy in a storage device such as a capacitor; or numerous other applications.

Figure 17:
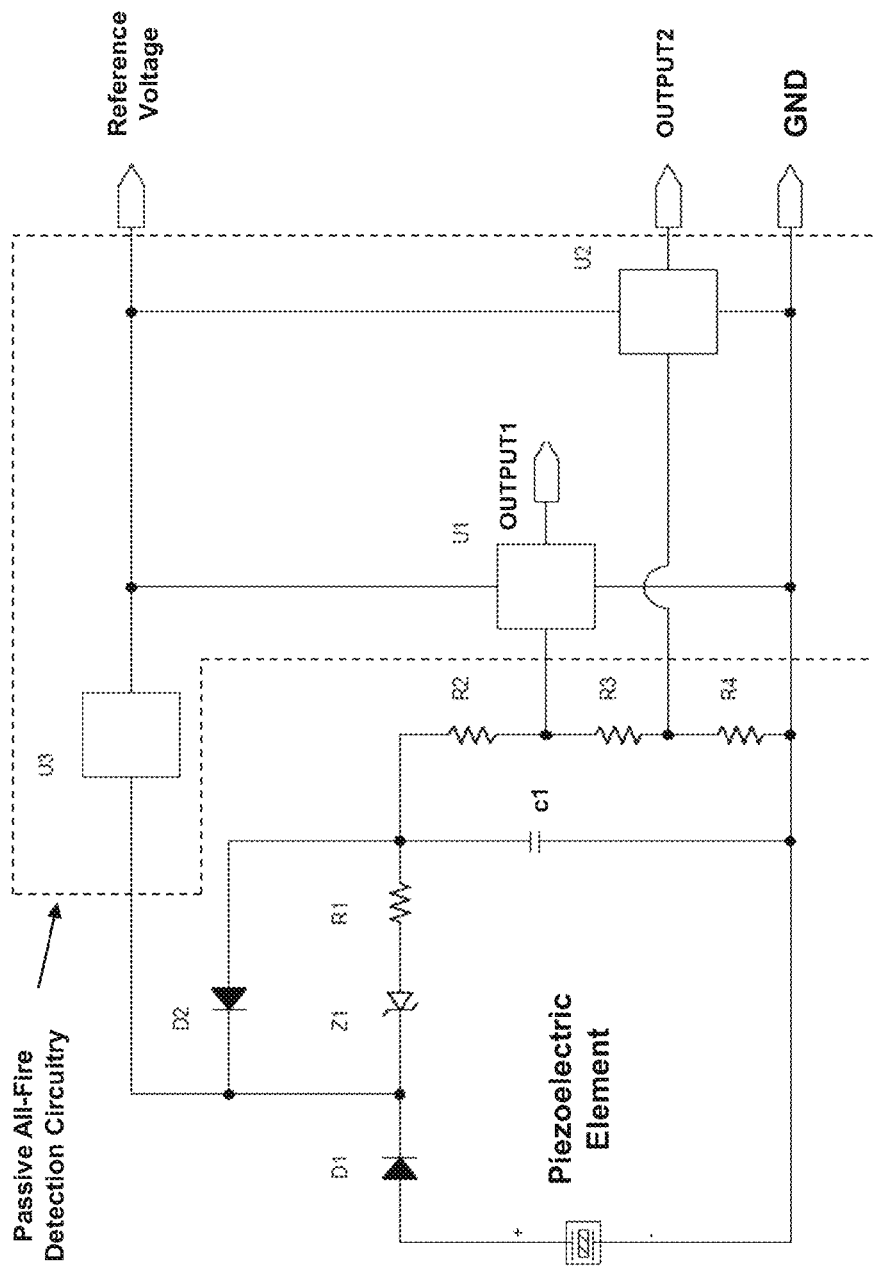
FIG. 17 illustrates the basic method for the design of a passive all-fire setback acceleration (shock) level detection sensor designed with the safety and all-fire detection circuitry of the embodiment of FIG. 13.

The method of designing the aforementioned "passive all-fire detection sensors" is shown in the schematic of FIG. 17. In FIG. 17, the "passive all-fire detection circuitry" portion of the circuitry enclosed by dashed lines. In this method, safety and all-fire detection circuitry shown in FIG. 13 is used provide logic signal flags when one or more firing setback acceleration (shock) levels are detected. In the schematic of FIG. 17, the circuitry provides logic signal flags for one or multiple firing setback acceleration levels (in the schematic of FIG. 17 for two firing setback or the like acceleration levels) that can be directly read by other devices through digital ports. In the circuitry of FIG. 17, this capability is provided by the addition of the indicated logic level comparators U1 and U2 to compare the outputs OUTPUT 1 and OUTPUT 2 of the safety and all-fire detection circuitry shown in FIG. 13 (with the addition of the voltage divider resistor R4 for the indication of the second prescribed firing setback or the like acceleration level indicated by OUTPUT 2) with the output level from a reference voltage supply (U3) and generate compatible logic level outputs (preferably a logic signal voltage level appropriate for the detecting device electronics). It is appreciated by those skilled in the art that by providing appropriate additional resistors (in addition to the resistor R4), other voltage levels (i.e., other firing setback or the like acceleration levels) may be similarly detected.

It is appreciated by those skilled in the art that there are many methods and means to implement the aforementioned logic level comparator components of the passive all-fire detection sensor circuitry of FIG. 17 such as the use of an op-amp. However, in a preferred embodiment of the present invention, Schmitt triggers are used since in these devices the threshold voltage to which the signal is compared depends on the state of output. This feature is particularly advantageous when the signal rises (or falls) through the switching region in a "noisy" or fluctuating manner since a Schmitt trigger would provide only one switching output, unless the fluctuations are of amplitudes greater than its threshold range.

Figure 18:
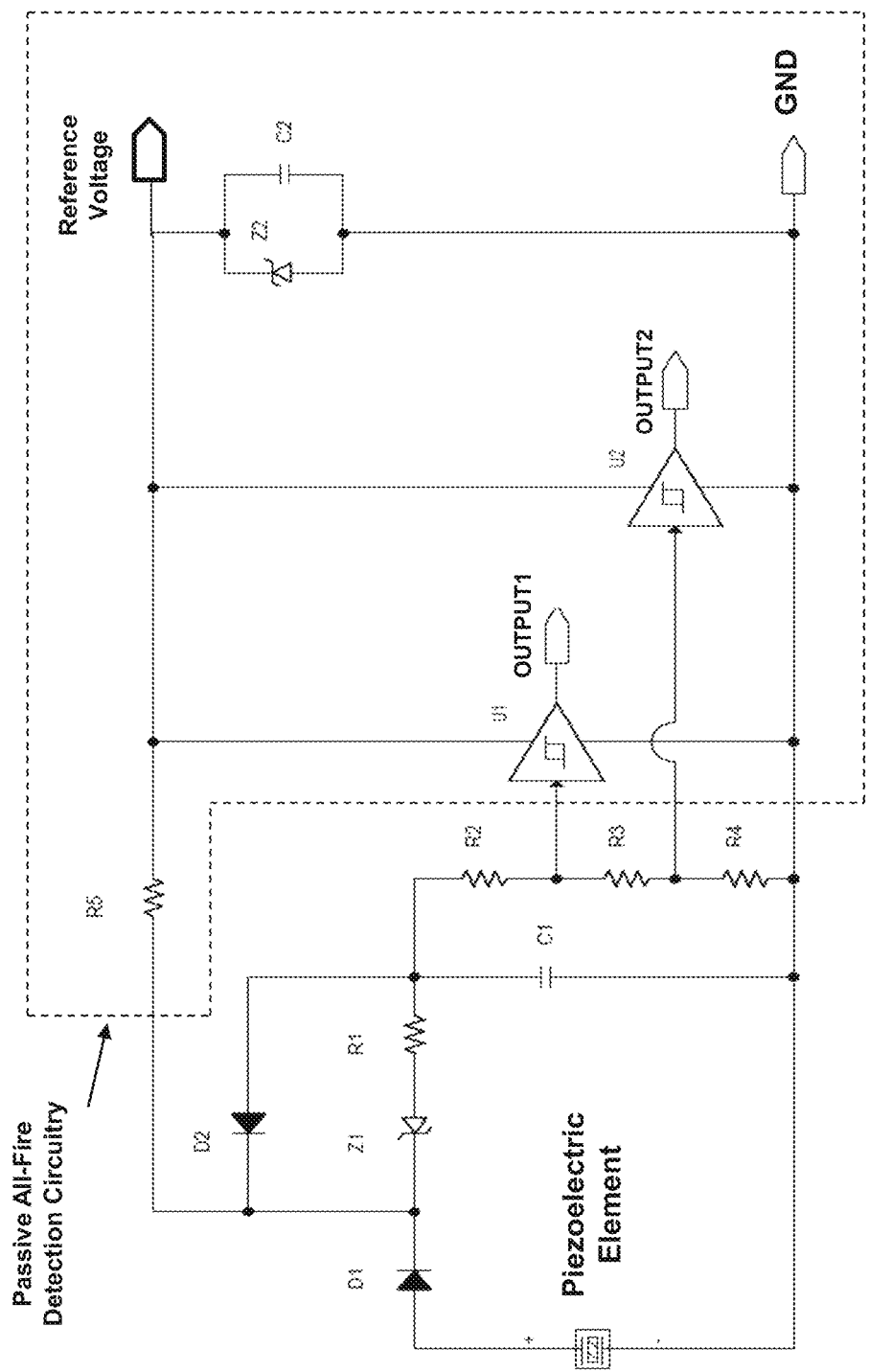
FIG. 18 illustrates an embodiment of the passive all-fire setback acceleration (shock) level detection sensor of FIG. 17 as implemented with Schmitt triggers suitable for use in munitions or other similar applications with environmental noise and/or high shock level fluctuations.

A typical preferred implementation of the passive all-fire detection sensor circuitry of FIG. 17 with the aforementioned Schmitt triggers for detection of two firing setback acceleration (shock) levels is shown in the schematic of FIG. 18. This embodiment of the present "passive all-fire detection sensors" is also designed to operate with very low power to make it possible to package the device in a very small volume. In this embodiment, the "passive all-fire detection circuitry" enclosed by dashed lines is designed to provide logic signal flag(s) for one or multiple firing setback acceleration (shock) levels, in the particular case of the embodiment of FIG. 18 for two firing setback acceleration (shock) levels, that can be directly read/detected by other devices, preferably through digital ports.

It is appreciated by those skilled in the art that in the safety and all-fire detection circuitry shown in FIG. 13, the proportion of the resistors R2 and R3 were indicated to be selected to provide the desired voltage level at the indicated OUTPUT when the voltage on the capacitor C1 reaches the level corresponding to the prescribed all-fire setback acceleration (shock) level. The voltage at the said circuit OUTPUT can then be designed to correspond to any desired voltage level for detection in the case of the present embodiment or any other similar purposes. In a similar manner, the proportions of the resistors R2, R3 and R4 are selected to provide the desired voltage level at the indicated OUTPUT 1 (FIGS. 17 and 18) when the voltage on the capacitor C1 reaches the level corresponding to the prescribed all-fire setback acceleration (shock) level. However, if the experienced all-fire setback acceleration (shock) level is higher than that indicated by the OUTPUT1, then when the voltage at the capacitor C1 reached to a voltage corresponding to the said higher (second) voltage level corresponding to the higher (second) all-fire setback acceleration (shock) level, then the voltage at the indicated OUTPUT2 would increase and reach a higher (second) desired voltage level (FIGS. 17 and 18). The said voltage level at the OUTPUT2 would then provide the indication of the second (higher) all-fire setback acceleration (shock) level having been reached. It is appreciated by those skilled in the art that more resistors may be similarly provide (in series with the resistors R2, R3 and R4) to divide the voltage at the capacitor C1 to more different voltage levels, each corresponding to increasing levels of all-fire setback acceleration (shock) levels experienced by the disclosed passive all-fire detection sensors of the embodiments of FIGS. 17 and 18.

It is appreciated by those skilled in the art that typical current logic signal voltage levels are 3.3V and 5V CMOS level or +/−12V. To provide such compatible voltage levels at the OUTPUT1 and OUTPUT2 (and other output levels if present) in the embodiments of FIGS. 17 and 18 or the like; a reference voltage supply is also required. Such a reference voltage supply may be provided in a number of ways. In a preferred embodiment of the present invention shown in the schematic of FIG. 18, the Zener diode Z2 together with the current limiting resistor R5 and the capacitor C2 provide a desired reference voltage level to the Schmitt triggers U1 and U2 from the rectified piezoelectric output. Here the low leakage Zener diode Z2 clips the reference voltage to its breakdown voltage to provide a precise desired reference voltage level. The Schmitt triggers U1 and U2 also reduce noise impact on the high input impedance logic gates of the user provided circuitry.

The operation of the "safety and all-fire detection circuitry" embodiments of FIGS. 13, 19 and 19A were described for the detection of prescribed all-fire conditions in terms of the munitions firing setback acceleration level and its duration. All other no-fire conditions, such as lower level shock loading and vibration due to transportation or short duration shock loading due to accidental drops and other similar events and high noise are differentiated from the prescribed all-fire condition. The operation of the "safety and all-fire detection circuitry" embodiments of FIGS. 13, 19 and 19A when used with an "output voltage threshold detection and switching element" to allow direct flow of current from the piezoelectric element through the indicated "initiator bridge wire" (or any other electrical or electronic or the like elements) to the ground as previously described for the embodiments of FIGS. 14-16 and the operation of the passive "passive all-fire detection sensor" embodiments of FIGS. 17 and 18 were also described for prescribed munitions all-fire setback accelerations level and duration (all-fire condition) detection and operation while rejecting all aforementioned "no-fire" conditions. It is, however, appreciated by those skilled in the art that any one of the above embodiments of the present invention may also be used to detect other shock or vibration or acoustic noise or other similar acceleration levels instead of the said all-fire setback acceleration (shock) levels and similarly operate the circuitry of embodiments of FIGS. 13-19 and 19A.

In certain munitions applications, instead of detecting firing setback (shock) loading, it is highly desirable to provide a sensor that can detect one or more impacts of the munitions with the target and their time history. The munitions may encounter more than one impact, for example, by impacting more than one barrier such as a building wall or ceiling or other multi-layer structures provided to protect the target. In such applications, particularly when multiple impacts are encountered, it is usually also desired to for the munitions electronics and logics circuitry and/or processor(s) to also have an indication of the impact time, duration and level. In such applications, the munitions is generally provided with the source of electrical energy such as charged capacitors or super-capacitors and/or chemical batteries and/or electrical energy generated by devices harvesting energy from the environment such as shock loading or vibration or vibratory motions or the like to power its microprocessor(s), electronic and logics circuitry and other electrically powered devices.

In the following, the methods of employing the aforementioned "safety and all-fire detection circuitry" of embodiments of FIG. 13 or 19 or 19A to design sensors for detecting one or more target impact (shock) loading and preferably their impact levels as a function of time are described and examples of their preferred implementation are provided. Hereinafter in the present disclosure such sensors are generally referred to as the "impact detection and time history sensors". It is appreciated by those skilled in the art that such a sensor which is designed to detect (usually significant) barriers, are in fact also detecting (relatively) free space (or void) between such barriers, and are therefore hereinafter may also be referred to as "void detectors" or "void counter".

Figure 20:
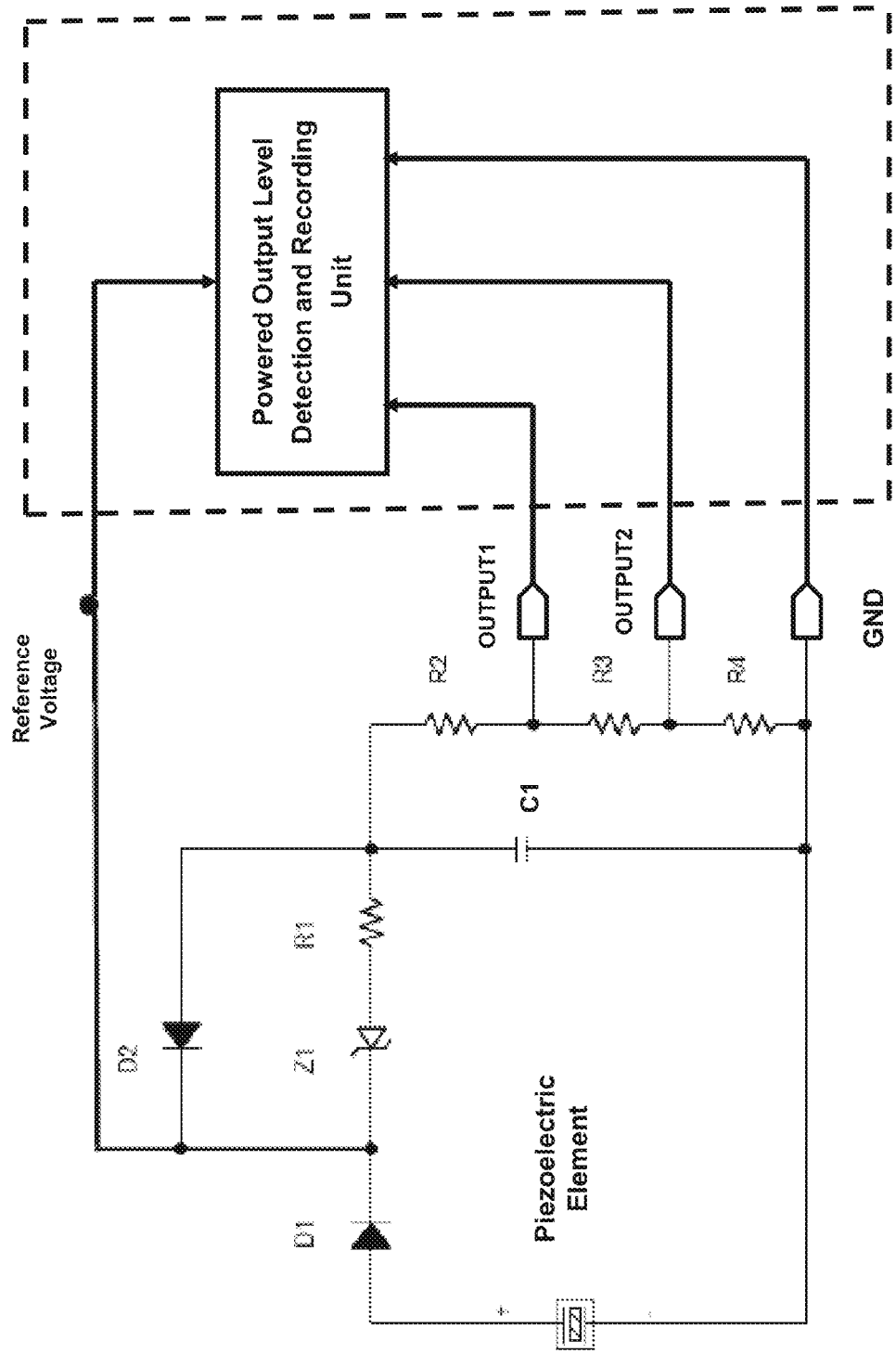
FIG. 20 illustrates an embodiment of the "impact detection and time history sensor" used to detect and "record" the numbers and levels of impacts that are encountered by munitions or the like over a period of time.

The method of designing the aforementioned "impact detection and time history sensors" (or alternatively indicated as "void detector" or "void counter") is described with the schematic shown in FIG. 20. As can be observed, the sensor employs the previously described "safety and all-fire detection circuitry" of the embodiment of FIG. 13 (or its alternative embodiments of FIGS. 19 and 19A). In the schematic of FIG. 20, the "impact detection and time history sensor" circuitry portion of the sensor embodiment is shown enclosed by dashed lines. In this method, the "safety and all-fire detection circuitry" of the embodiment of FIG. 13 (or its alternative embodiments of 19 and 19A) is to detect target impact by the munitions in which the said sensor is mounted and "record" the time history of the detected impacts. The process of detecting impact is identical to those described for the embodiments of FIGS. 13, 19 and 19A for the detection of all-fire setback (shock) acceleration except that all-fire setback acceleration is applied to munitions in the direction of their travel for them to gain velocity while the target impact-based deceleration (hereinafter, acceleration and deceleration may be used interchangeably—i.e., without regard to the sign of the rate of change of the sensor velocity) is essentially in the opposite direction and acts to decelerate the munitions along its path of travel (neglecting any generally present sideway acceleration due to an angled target impact or impact with a target with non-uniform resistance to the impact). In general, the "impact detection and time history sensor" embodiment of FIG. 20 may be designed to detect either only the target impacts or both all-fire setback (shock) acceleration as well as target impacts.

It is also appreciated by those skilled in the art that the circuitry output(s) may be similarly used to provide logic signal flags when a target impact of one or more prescribed shock levels and durations is encountered, as for example implemented in the low power circuitry of FIG. 18. Then as shown in the schematic of FIG. 17 and its example of implementation in FIG. 18, the circuitry provides logic signal flags for one or multiple target impact shock acceleration levels that can be directly read by other devices through digital ports. The use of the said and previously described logic signal flags, minimal detection electronics and computational capability are required to be provided in the "powered output level detection and recording unit" of the "impact detection and time history sensor" of the embodiment of FIG. 20.

The operation of the "safety and all-fire detection circuitry" embodiments of FIGS. 13, 19 and 19A were described for the detection of prescribed all-fire conditions in terms of the munitions firing setback acceleration level and its duration. In the "impact detection and time history sensor" of the embodiment of FIG. 20, target impact(s) to one or more prescribed impact shock levels are similarly detected. All other "non-impact" conditions, such as lower level shock loading due to encounters with very light structures or objects and vibration during the flight and other similar events and high noise are differentiated from the prescribed impact conditions (usually shock levels and durations). The "passive all-fire detection sensor" embodiments of FIGS. 17 and 18 can also be used as described previously for the detection of prescribed munitions all-fire setback accelerations level and duration (all-fire condition) and rejection of all aforementioned "no-fire" conditions to detect munitions target impact(s) to one or more prescribed impact shock levels (thresholds) while differentiating them from all other "non-impact" conditions.

In the schematic of the basic embodiment of the "impact detection and time history sensors" (or alternatively indicated as "void detector" or "void counter") shown in FIG. 20, as was previously described for the "safety and all-fire detection circuitry" of the embodiment of FIG. 13 (or its alternative embodiments of 19 and 19A), when the munitions equipped with the present "impact detection and time history sensor" impacts a target (here considered to be a significant barrier like a bunker wall or the like—with a significant barrier hereinafter defined as those that cause at least the first prescribed impact threshold level and duration of the "impact detection and time history sensor" to detect it as an impact event), a prescribed impact condition is similarly detected by the voltage level of the capacitor C1 while the circuitry prevents the charging of the capacitor C1 to the prescribed voltage level if the generated piezoelectric charges are due to the aforementioned non-impact conditions (no-fire conditions for the case of the for the case of embodiments of FIGS. 13, 19 and 19A) are encountered. Once an impact condition is detected, the provided "powered output level detection and recording unit" of the "impact detection and time history sensor" shown in FIG. 20 "records" the event and its relative time of occurrence. The said detection and "recording" capabilities of the "impact detection and time history sensors" may be implemented in numerous different schemes and using different electronics components and logics circuitry and/or micro-processor most appropriate for the application at hand and the device(s) using the generated information. In munitions applications, however, the main issues of concern in addition to reliability and safety also include low power requirement, volume efficiency (i.e., miniaturization capability), firing setback and harsh environment survivability.

Examples of the implementation of the present "impact detection and time history sensors" of the embodiment of FIG. 20 are provided. It is appreciated by those skilled in the art that the following embodiments of the present "impact detection and time history sensors" (or alternatively indicated as "void detector" or "void counter") inventions are provided only as examples of their possible implementation, particularly for munitions applications, and should not be considered as an intention to exclude other implementations of the said sensor design.

In the schematic of the embodiment of FIG. 20, the "powered output level detection and recording unit" portion of the "impact detection and time history sensor" embodiment is shown enclosed by dashed lines. In the present method, the "safety and all-fire detection circuitry" of the embodiment of FIG. 13 (or its alternative embodiments of 19 and 19A) is used as previously described to detect target impact by the munitions in which the said sensor is mounted and "record" the time history of the detected impacts. In the embodiment of FIG. 20, the "safety and all-fire (in this case target impact) detection circuitry" (hereinafter also referred to as "safety and target impact detection circuitry") as is shown to be used to detect two levels of target impact shock levels at OUTPUT1 and OUTPUT2, even though as it was previously described for the embodiment of FIGS. 17 and 18, more than two target impact levels may also be similarly made detectable.

Figure 21:
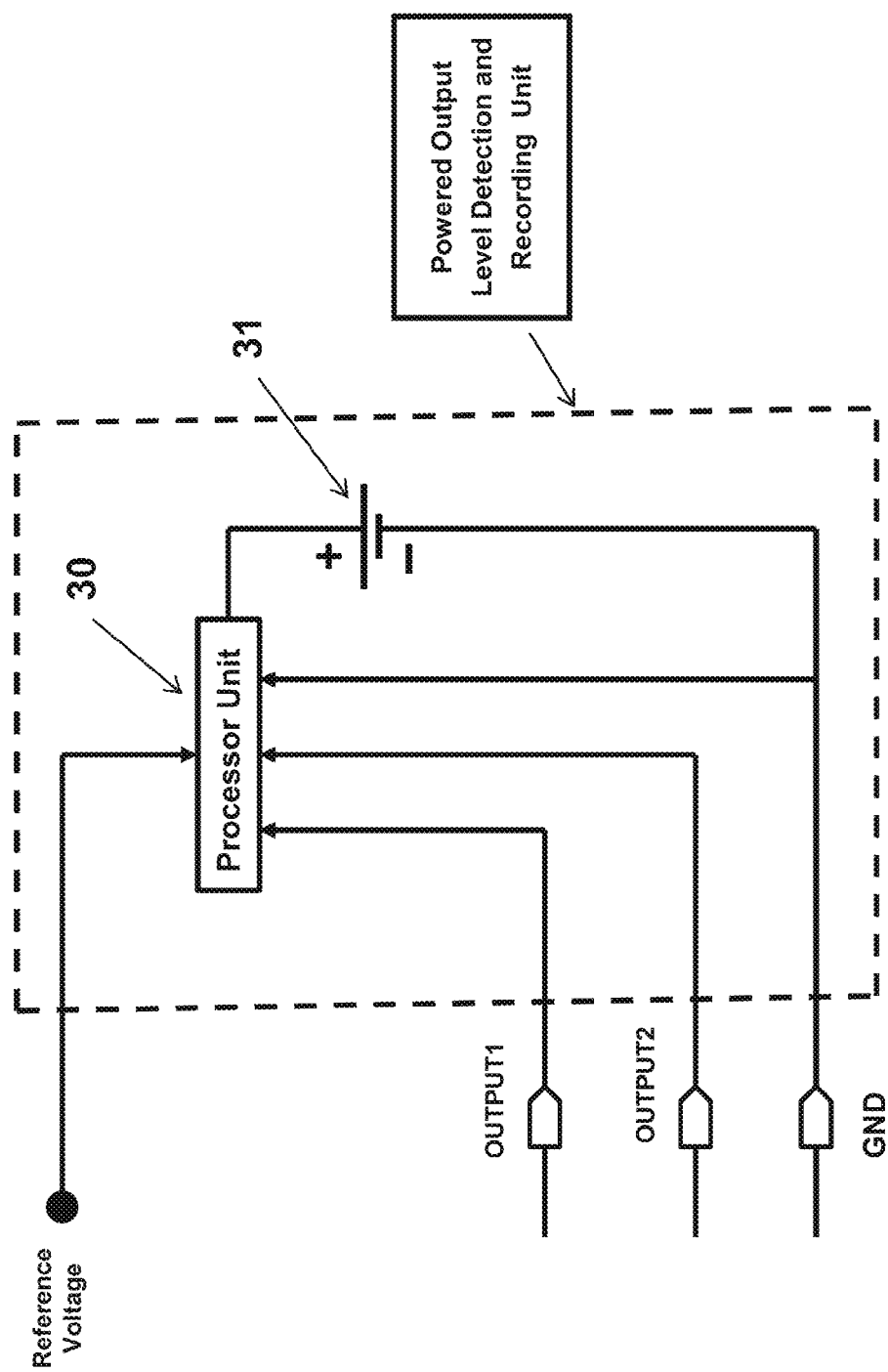
FIG. 21 illustrates an embodiment of the implementation of the "impact detection and time history sensor" of FIG. 20.

In one "impact detection and time history sensor" embodiment, the "safety and target impact detection circuitry" of the embodiment of FIG. 20 is used to provide logic signal flags (for example, as was described for the embodiment of FIG. 18) for one or multiple target impact shock acceleration levels (in the schematic of FIG. 20 for two target impact shock or the like acceleration levels) that can be directly read by the processor unit 30 (or other appropriate logic circuitry or devices) through digital ports as shown in FIG. 21. The processor unit 30 is considered to be equipped with input digital ports, appropriately sized memory, timing source, etc., that are commonly provided on such signal processing units as is well known in the art. As examples, the processor unit 30 may be constructed with CY8C21334-12PVXE from Cypress Semiconductor Corporation which has an internal RC clock and that can work in a wide range of temperatures can be used. For this In FIG. 21, the "powered output level detection and recording unit" portion of the present "impact detection and time history sensor" embodiment (see FIG. 18) is indicated by dashed lines.

In the schematic of FIG. 21, the indicated outputs OUTPUT 1 and OUTPUT 2 are considered to be outputs of the logic level comparators U1 and U2 (see the schematic of FIG. 18). The reference voltage (FIG. 18) may be provided as shown for the embodiment of FIG. 18 or directly from the power source 31 of the "powered output level detection and recording unit" as shown in FIG. 20. As a result, when the munitions impacts a target, when the impact shock acceleration level reaches the prescribed threshold of the first logic level comparator U1, the OUTPUT1 provides a signal indicating the event (preferably by a logic signal voltage level appropriate for the detecting device electronics, for example a 3.3V or 5V or +/−12V as described for the embodiments of FIGS. 17 and 18). Similarly, if the impact shock acceleration level increased further and reaches the prescribed threshold of the second logic level comparator U2, the OUTPUT2 would then provide a signal indicating the said event. In a similar manner, if more than two logic level comparators are provided in the "safety and all-fire detection circuitry" of the embodiment of FIG. 20 (as described for the embodiment of FIG. 13 or its alternative of FIGS. 19 and 19A and the embodiments of FIGS. 17 and 18), each prescribed impact shock acceleration level that is reached generates a signal indicating the event to the processor unit 30. The processor would then "record" each event and their relative time.

It is appreciated by those skilled in the art that as was previously described for the embodiments of FIGS. 13-19 and 19A, when the when the munitions encounter with a significant barrier ends, i.e., when the munitions exits the barrier, the piezoelectric voltage drops (to near zero) below the voltage level on C1 and the diode D2 causes essentially all charges accumulated in the capacitor C1 to be discharged. As a result, the outputs OUTPUT 1 and OUTPUT 2 of all logic level comparators U1 and U2 will drop to near zero, indicating to the processor unit 30 that the target has been essentially exited (at least up to its softer portion indicated to be below the threshold of the first logic level comparator U1). Similarly, once the impact threshold level falls below the level indicated by the logic level comparator U2, the OUTPUT2 of the said comparator drops to near zero, thereby similarly indicating the said event to the processor unit 30.

Figure 22:
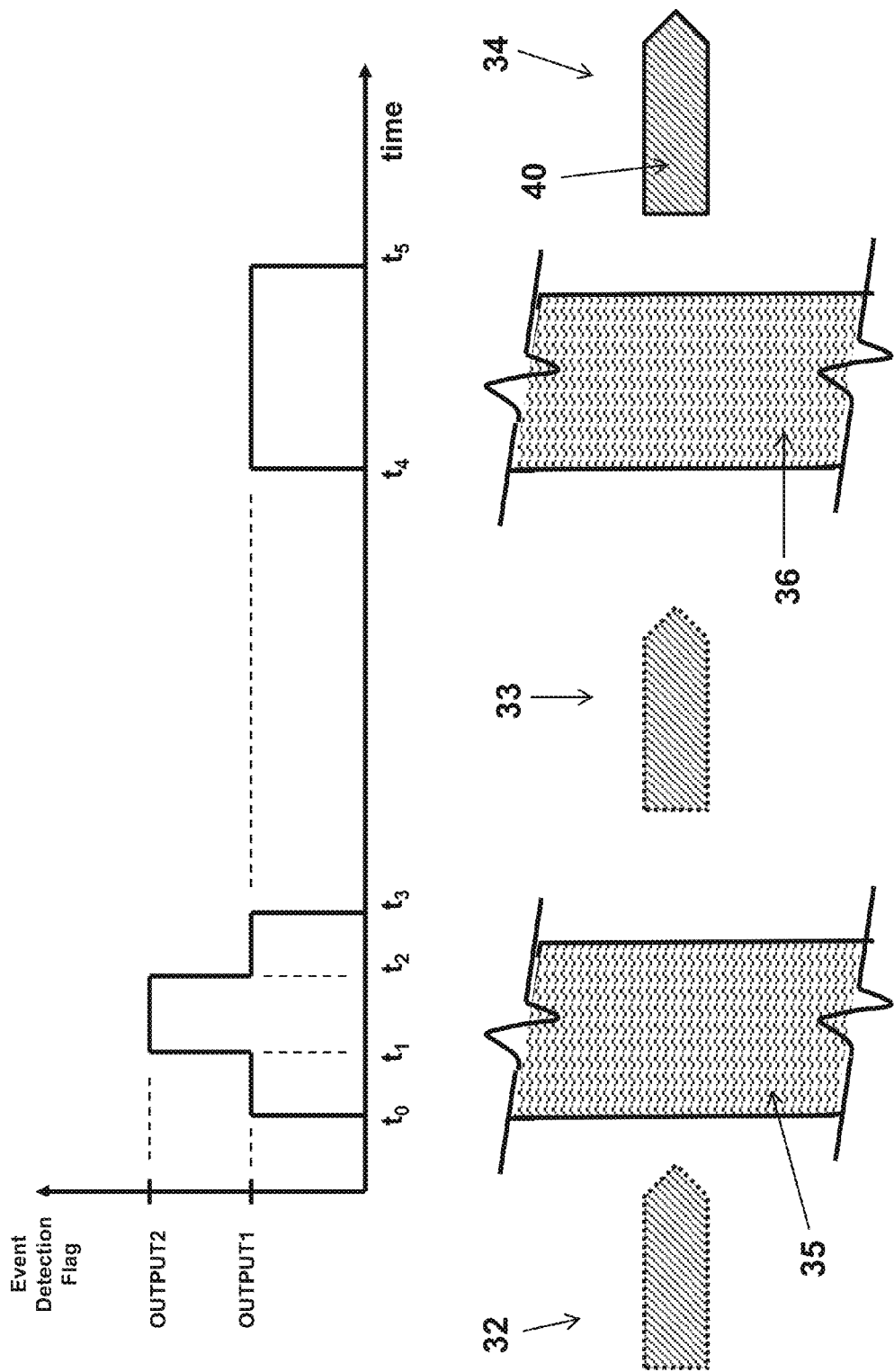
FIG. 22 is a plot of the "impact detection and time history sensor" of the embodiment of FIG. 20 "recording" of the encounter of the munitions using the sensor with two significant barriers.

As an example, if the munitions in which the present "impact detection and time history sensor" embodiment of FIGS. 20-21 is mounted encounters two significant barriers (i.e., barriers that cause at least the first prescribed impact level and duration of the "impact detection and time history sensor" to detect it as an impact event), then the time history of the detected events may look as shown in the plot of FIG. 22. In the plot of FIG. 22, the munitions 40 is shown in the positions 32, 33 and 34, corresponding to its position prior to encountering the significant barrier 35, after having encountered the significant barrier 35 and prior to encountering the significant barrier 36 and after having encountered the significant barrier 36, respectively. The top graph of FIG. 22 is intended to show the output flag activation condition as a function of time as the munitions 40 travels from its position 32 through the significant barrier 35 and then travels through its position 33 to the significant barrier 36 and through it to its position 34. In the top graph of FIG. 22, the "impact detection and time history sensor" that is mounted in the munitions 40 is considered to experience the impact with the significant barrier 35 and at the indicated time $t_o$ detect the aforementioned first target impact shock level and thereby generate an output flag at the OUTPUT1, with the impact shock level increasing to the aforementioned second target impact shock level and thereby generating an output flag at the OUTPUT2 at the indicated time $t_1$. The impact shock level experienced by the munitions 40 is then considered to stay around the aforementioned second impact shock level until the time $t_2$, at which time the impact shock level drops below the said second but above the first impact shock level and stays in the same region until the time $t_3$, at which time the impact shock level drops below that of the aforementioned first impact shock level. The munitions 40 then travels towards the second significant barrier 36 and at the time $t_4$ the "impact detection and time history sensor" is considered to detect the aforementioned first target impact shock level and thereby generate an output flag at the OUTPUT1 until the time $t_5$, at which time the impact shock level drops below that of the aforementioned first impact shock level.

In an embodiment, processor unit 30 of the "impact detection and time history sensor" embodiment of FIGS. 20-21 is provided with a timing clock, I/O ports and the related components and enough memory capacity to record the events indicated in the top graph of FIG. 22 in terms of the generated output flags and their relative times of occurrence $t_0$-$t_5$ for use for other electrical and electronics units of the munitions.

It is appreciated by those skilled in the art that the aforementioned time $t_0$ and $t_4$ would usually occur slightly after the munitions impact with the significant barriers 35 and 36, respectively, and that the amount of such delays is dependent on the resistance of the encountered significant barrier surfaces and the strength characteristics of the munitions structure, particularly around its impacting surfaces to the location of the "impact detection and time history sensor" mounting.

Figure 23:
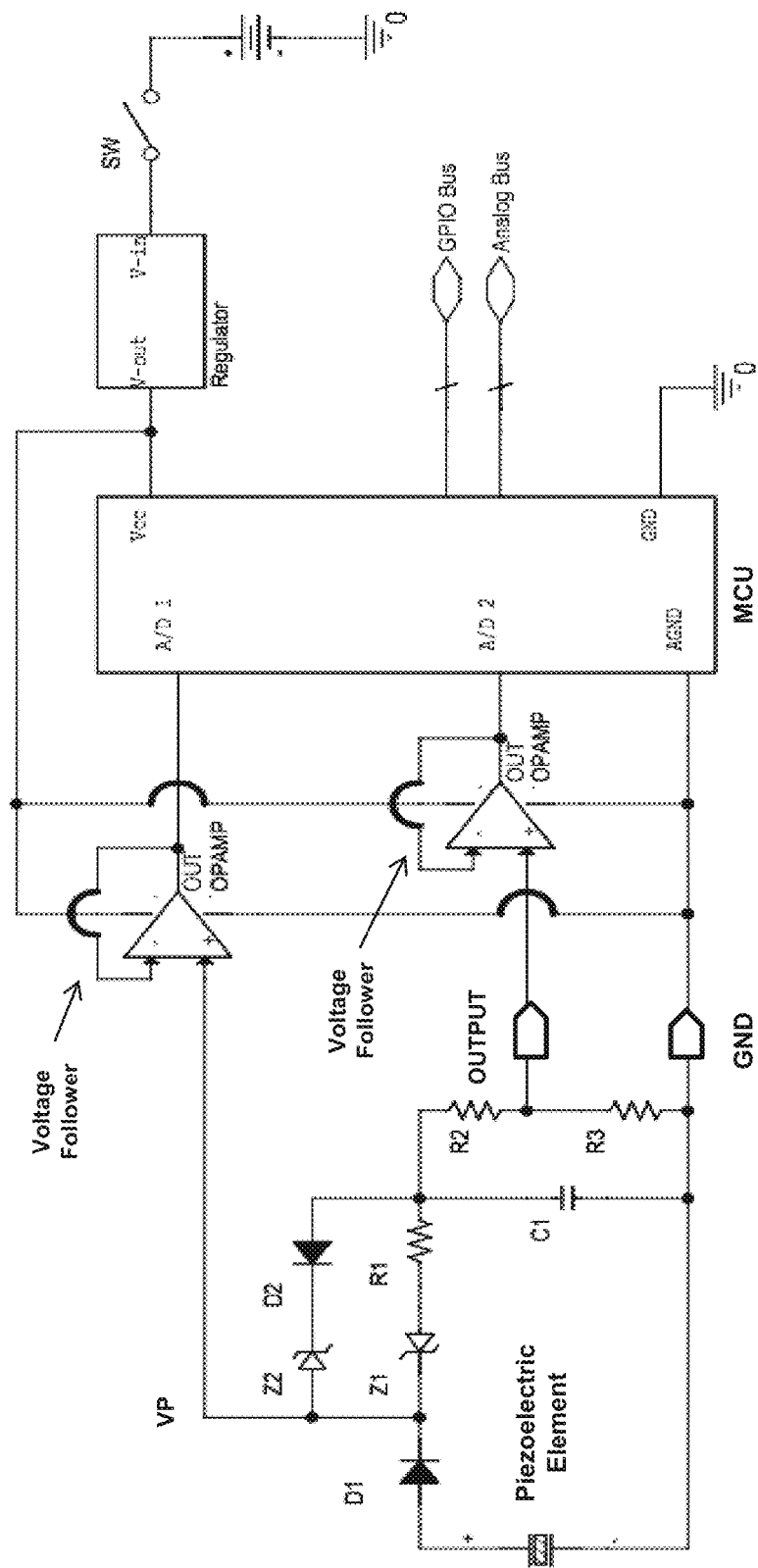
FIG. 23 illustrates another embodiment of the implementation of the "impact detection and time history sensor" of FIG. 20.

A schematic of an alternative embodiment of the "impact detection and time history sensor" of FIGS. 20 and 21 is shown in the schematic of FIG. 23. This embodiment employs one of the basic "safety and all-fire detection circuitry" of embodiments of FIG. 13 or 19 or 19A to design sensors for detecting one or more target impact (shock) loading and their impact level profiles as a function of time. It is appreciated by those skilled in the art that as was previously indicated, such sensors which are designed to detect (usually significant) barriers, are in fact also detecting (relatively) free space (or void) between such barriers and can also be referred to as "void detectors" or "void counter". In the example of basic implementation of the present embodiment shown in FIG. 23, the voltage signals from the "safety and all-fire detection circuitry" output (indicated as OUTPUT in the schematic of FIG. 23) and the piezoelectric element voltage output (indicated as VP in the schematic of FIG. 23) are connected to the analog-to-digital converter (A/D) inputs of the MCU (micro-controller unit) via voltage followers, which can be implemented with the Texas Instruments OPA2277 high precision operational amplifier as is well known in the art.

The ground "safety and all-fire detection circuitry" (GND) is connected to the analog ground of the MCU. It is noticed that the voltage followers can also be configured to specific gain with resistors, so that they scale the voltage to be measured at the OUTPUT of the "safety and all-fire detection circuitry" as well as the voltage VP of the piezoelectric element (usually down) to the measurement range of A/D converters of the MCU.

The micro-controller unit (MCU) may be of any type appropriate of the specific application. As an example, we may use a model CY8C28243-24PVXI from Cypress Semiconductor Corporation for this purpose. Such a MCU features on-chip RC clock of up to 48 MHz with 2.5% fabrication accuracy, and is integrated with 16 KB flash memory, 1 KB SRAM memory and A/D modules (up to 15.6 k sample rate at 6 bit resolution). Additional memory may also be added depending on the selected sampling rates and the total length of time that sampling is desired to be continued.

In general, a voltage regulator can provide proper voltage source from power supplier (a battery or capacitor or supercapacitor or the like) to the MCU. The switch SW enables the MCU to start the program. The switch can for example be a simple manual on/off switch when the system is used in the laboratory for testing purposes, or when used in munitions, it could be an electronic switching device similar to the one described for the embodiment of FIG. 16, which is similarly powered by the piezoelectric element or could be a latching G-switch that is turned on by the firing setback acceleration and would stay on following activation.

Once the switch SW is closed, the MCU would continuously sample voltage signals ay A/D 1 and A/D 2, FIG. 23, and store the information as a function of time in the device internal and external (if provided) memory or is transmitted directly to the host processor (munitions control system processor, which may be the MCU itself) for processing. As a result, essentially continuous time history of impact shock levels are provided by the device once such impacts with levels above the prescribed levels are detected. For example, considering significant barrier encounters shown in the schematic of FIG. 22, the MCU is preferably programmed to ignore the A/D 1 input until it reaches the aforementioned prescribed level indicating an encounter with a significant barrier (time $t_0$ in the plot of FIG. 22), and sample/record or process impact shock levels until the time $t_3$, when the munitions 32 has exited the significant barrier 35. As a result, a nearly continuous profile of impact shock level, i.e., barrier "strength", as a function of time is measured (as compared to the step-wise output shown in the plot of FIG. 22 for the portion of the shock levels between the indicated OUTPUT1 and OUTPUT2). It is also appreciated by those skilled in the art that since the munitions velocity is approximately known or readily calculated, the impact shock level profile as a function of the barrier thickness is also approximately determined. The impact shock level is similarly measured during the round 32 encounter with the second significant barrier 36, FIG. 22.

When a relatively short string of data is to be recorded, a circular buffer can be formed. Algorithms well known in the art can then be run in the MCU processor to monitor the buffer. Then when the buffer indicates a valid event sequence, for example for the case of munitions, when a prescribed type and number of encounters with previously described significant barriers are detected, the algorithm would pass the information to the munitions control processor for decision making purposes or in testing equipment, would save the data on its non-volatile memory.

The rest of the available GPIO (general purpose input/output) bus and analog (A/D and D/A) bus of the MCU can be used to input/output digital flags and analog control signals. For example, by using two GPIO pins as SCLK and SDATA, an I2C serial port can be implemented for communicating with host processor (if provided) to upload the samples stored in MCU's memory.

It is appreciated by those skilled in the art that the "impact detection and time history sensor" embodiment of FIG. 23 has the advantage of being capable of providing essentially continuous impact shock level information once the prescribed impact threshold level and duration has been reached. In contrast, the embodiments of FIGS. 20 and 21 provide a step-wise, multi-level indication of the impact shock level information. The latter information is usually sufficient in many applications. In addition, the embodiments of FIGS. 20 and 21 also have the advantage of requiring relatively simple electronics to construct without the need of MCUs and A/Ds and the like. Thereby these devices become significantly less complex, less costly and faster in response.

It is also appreciated by those skilled in the art that more than one "impact detection and time history sensor" (of either one of the embodiments of FIG. 20, 21 or 23) may be mounted in munitions (e.g., round 32 shown in FIG. 22) to detect/measure impact shock levels along the path of travel of the round (see FIG. 22) as well as in the lateral direction(s). In a preferred embodiment, at least three such "impact detection and time history sensors" are used and at least one is oriented to detect/measure impact shock level in the axial direction (i.e., along the path of travel of the round) and at least two are used to detect/measure impact shock levels in two independent lateral directions (preferably orthogonal directions). In such configurations, the impact detection and time history sensors are capable of providing information as to the direction of target impact and/or the structural characteristics of the impacted and penetrated target.

It is noted that the piezoelectric elements used in the embodiments of FIGS. 13-21 and 23 are in fact electrical energy generators that convert mechanical energy to electrical energy (charges) that are then used to power the described circuitry and elements. It is also noted that the indicated piezoelectric elements are assemblies containing piezoelectric (preferably stack) elements and in general other elements such as mass and spring (elastic) elements that are packaged in a particular manner to allow them to generate the said electrical energy when subjected to a prescribed shock loading direction. In the following, the basic methods of packaging to construct such piezoelectric-based electrical energy generators suitable for the present applications are described in detail. It is, however, noted that the provided example of such packaging is provided only for describing the disclosed basic methods and are not intended to limit this disclosure to this particular packaging configuration.

Figure 24:
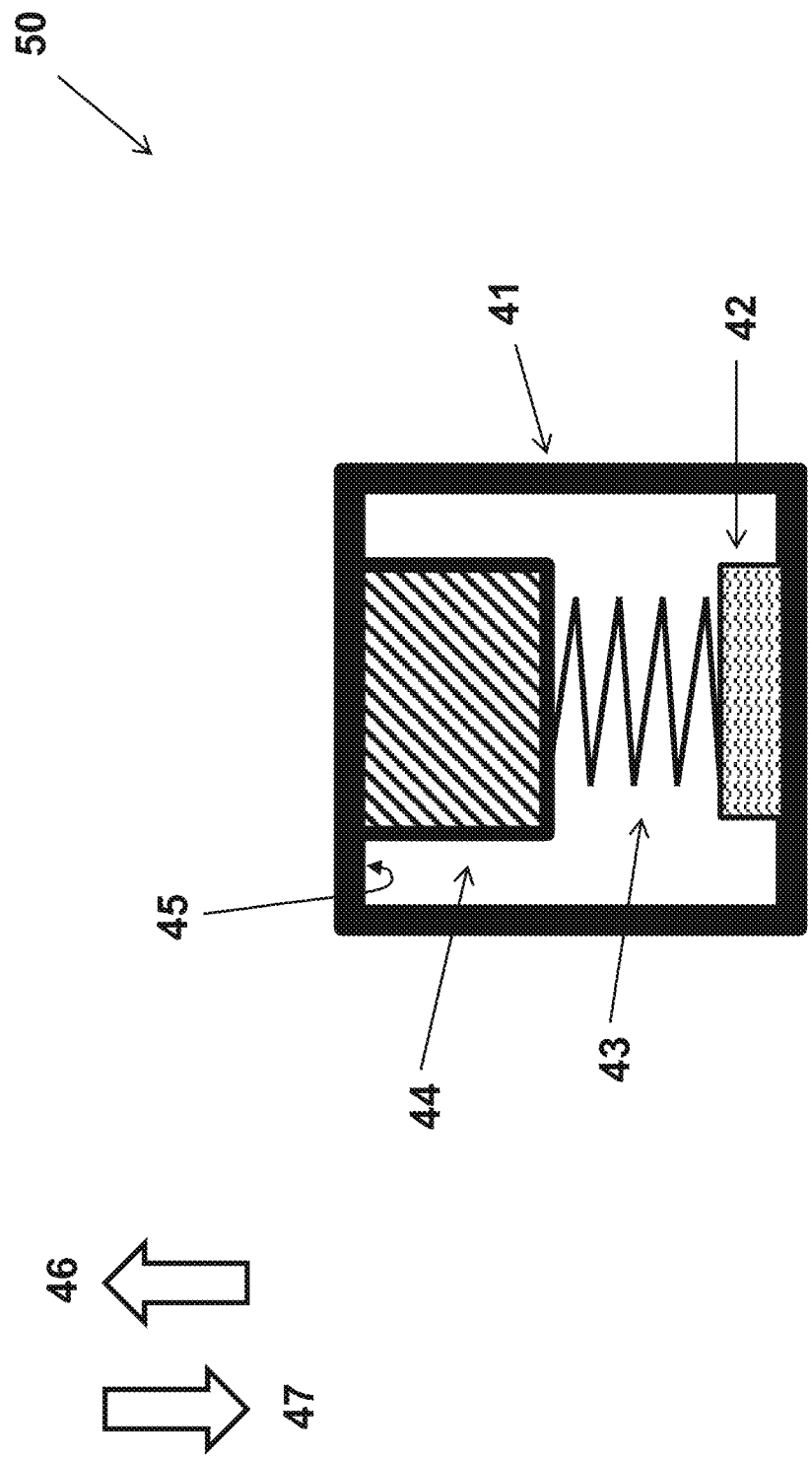
FIG. 24 is the schematic of the embodiment of a piezoelectric-based powering source for use in the embodiments of FIGS. 13-21 and 23.

In one embodiment, the aforementioned piezoelectric-based electrical energy generator 50 (herein referred to as "piezoelectric element") of the embodiments of FIGS. 13-21 and 23 is packaged as illustrated schematically in FIG. 24. The piezoelectric element 50 is provided with a housing 41, which could for example cylindrically shaped or any other shape that best matches the available space in the device it is being mounted. At least one piezoelectric (preferably stack) member 42 is fixedly attached to one side of the housing 41 (in the schematic of FIG. 24 to the bottom surface of the housing 41 as seen in the illustration). A mass 44 is then positioned above the piezoelectric member 42 together with the spring (elastic) element 43, which separates the mass 44 from the piezoelectric member 42 as shown in the schematic of FIG. 24. The spring element 43 is preferably preloaded in compression so that the mass element 44 is normally in contact with the top surface 45 of the housing 41, even when the subjected to certain level of acceleration in the direction of the arrow 46.

When the piezoelectric element 50 is used in the embodiments of FIGS. 14-16 to initiate pyrotechnic materials via the provided bridge wires as a result of the all-fire setback shock acceleration, or for the detection of one or more firing setback acceleration (shock) levels as was described for the embodiments of FIGS. 17 and 18, or for other firing setback acceleration (shock) purposes in the "safety and all-fire detection circuitry" embodiments of FIGS. 13, 19 and 19A, then the piezoelectric element 50 is mounted in the munitions such that it is oriented to experience the firing setback acceleration essentially in the direction of the arrow 46. The spring element 43 is generally selected to have relatively high stiffness and preloaded to keep the mass 44 in contact with the surface 45 of the housing 41. And if the device is subjected to acceleration (shock) loading in the direction of the arrow 47 (direction of the firing set-forward acceleration) or in the lateral directions, then level of forces acting on the piezoelectric member 42 is minimally changed, thereby the piezoelectric member would generate minimal charges. However, if the piezoelectric element 50 is subjected to shock loading due to the firing setback in the direction of the arrow 46, then the said acceleration would act on the inertial of the mass 44 and applies a force on the piezoelectric member 42 proportional to the mass of the mass 44 and the setback acceleration and thereby causes it to generate electrical charges to operate the aforementioned circuitry.

On the other hand, when the piezoelectric element 50 is used in the "impact detection and time history sensor" embodiments of FIG. 20, 21 or 23, then the piezoelectric element 50 is mounted in the munitions oriented such that it experiences the impact shock acceleration in the direction of the arrow 46. As a result, the firing setback acceleration will not generate a significant loading of the piezoelectric member 42 and thereby would not generate a significant amount of electrical charges to activate the said "impact detection and time history sensors".

It is appreciated by those skilled in the art that the aforementioned methods of designing the disclosed "safety and all-fire detection circuitry" embodiments of FIGS. 13, 19 and 19A; the embodiments of FIGS. 14-16 to initiate pyrotechnic materials via the provided bridge wires as a result of the all-fire setback shock acceleration; the passive shock detection embodiments of FIGS. 17 and 18; and the "impact detection and time history sensor" embodiments of FIG. 20, 21 or 23 as well as their similar implementations may be used to for non-munitions, including many industrial as well as commercial applications.

For example, the passive all-fire setback acceleration (shock) level detection sensors of the embodiments of FIGS. 17 and 18 may be used to detect vibration in machinery when its amplitude exceeds a prescribed threshold and provide input to the system control to take appropriate action such as reduce power or undergo emergency stop. In a similar manner, the sensors may be used to detect the start of a process in machinery and initiate certain processes; for example detect the start of drilling process at the drilling head of an oil or gas drilling equipment and thereby turn-on certain processes such turning on the sensory and control and data acquisition and transmission electronics to minimize power consumption or the like or perform other on/off switching or flagging action.

Even the embodiments of FIGS. 14-16 to initiate pyrotechnic materials via the provided bridge wires as a result of the all-fire setback shock acceleration can be used to initiate pyrotechnics and/or explosives used to actuate certain Cartridge Actuated Devices (CAD) for emergency actuation of valves or door/exits or ejection of pilot or initiate other emergency actions when an explosion or earthquake or other high-shock producing events have occurred.

It is appreciated by those skilled in the art that the safety and all-fire detection circuitries of FIGS. 13, 19 and 19A may be used in any of the embodiments of FIGS. 14-18, 20 and 23 depending on the application.

It is also appreciated by those skilled in the art that implementations other that the circuitry shown in the schematics of FIGS. 13-21 and 23 for the disclosed methods are also possible for achieving essentially the same functionalities. As such, the disclosed implementations of the disclosed methods as shown in the schematics of FIGS. 13-23 are to provide examples of their preferred embodiments and are not intended to limit their implementations only to the disclosed implementations.

It is also appreciated by those skilled in the art that as was described for previous embodiments of the present invention, a magnet and coil generator 20 that forms a vibrating mass-spring system shown in the schematic of FIG. 12 may be similarly used in place of or in addition to the piezoelectric elements of the embodiments of FIGS. 13-20 and 23.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A shock detection circuit comprising:
   an electrical energy generating device configured to generate a voltage over a duration responsive to an acceleration of the munition
   an input configured for generating an input voltage over a duration responsive to the acceleration;
   an electrical storage device configured to receive a portion of the input voltage over the duration and to thereby accumulate a charge,
   an output coupled to the electrical storage device;
   a first diode having a first anode coupled to the input and a first cathode coupled to the electrical storage device; and
   a comparator configured to compare a voltage at the output and a reference voltage and to produce a result based on the comparison;
   wherein the comparator is a processor that is configured to record the result.

2. The shock detection circuit of claim 1, wherein the processor is configured to record the result together with an indication of when the result occurred.

3. The shock detection circuit of claim 2, wherein the comparator is configured to continuously record results together with an indication of when each of the plurality of results occurred.

4. The shock detection circuit of claim 1, wherein the processor is configured to record a plurality of results together with an indication of when each of the plurality of results occurred.

5. The shock detection circuit of claim 1, wherein the reference voltage is selected so that the result is an indication of an impact.

6. The shock detection circuit of claim 1, wherein the shock detection circuit is one of a plurality of shock detection circuits with each oriented to produce a corresponding result based on a different direction of shock.

7. The shock detection circuit of claim 6, wherein each different direction of shock are orthogonal to each other different direction of shock.

8. The shock detection circuit of claim 1, wherein the shock detection circuit is a portion of an all-fire detection circuit for an electrically initiated inertial igniter munition.

9. A shock detection circuit comprising:
   an electrical energy generating device configured to generate a voltage over a duration responsive to an acceleration of the munition
   an input configured for generating an input voltage over a duration responsive to the acceleration;
   an electrical storage device configured to receive a portion of the input voltage over the duration and to thereby accumulate a charge,
   an output coupled to the electrical storage device;
   a first diode having a first anode coupled to the input and a first cathode coupled to the electrical storage device; and
   a comparator configured to compare a voltage at the output and a reference voltage and to produce a result based on the comparison;
   wherein the output is one of a plurality of outputs and the comparator is configured to compare a voltage at each of the plurality of outputs to produce a corresponding plurality of results based on the plurality of comparisons.

10. The shock detection circuit of claim 9, wherein the processor is configured to record the plurality of results together with an indication of when each of the plurality of results occurred.

11. The shock detection circuit of claim 9, wherein the reference voltage is selected so that each of the plurality of results are an indication of different levels of an impact.

12. A method of shock detection, the method comprising acts of:
   providing an electrical energy generating device to generate a voltage over a duration responsive to an acceleration;
   providing a first electrical storage device connected to the electrical energy generating device to receive a portion of the voltage over the duration and to thereby accumulate a charge;
   providing an output coupled to the electrical storage device to deliver a shock indication when at least a portion of the charge exceeds a first predetermined voltage; and
   recording a time of the shock indication.

13. The method of claim 12, wherein the shock is a vibration in a machine.

14. A method of shock detection, the method comprising acts of:
   providing an electrical energy generating device to generate a voltage over a duration responsive to an acceleration;
   providing a first electrical storage device connected to the electrical energy generating device to receive a portion of the voltage over the duration and to thereby accumulate a charge; and
   providing an output coupled to the electrical storage device to deliver a shock indication when at least a portion of the charge exceeds a first predetermined voltage;

wherein the output is one of a plurality of outputs, the method comprising acts of comparing a voltage at each of the plurality of outputs producing a corresponding plurality of results based on the plurality of comparisons.

15. The method of claim 14, comprising acts of recording each of the plurality of results together with an indication of when each of the plurality of results occurred.

16. The method of claim 14, wherein the reference voltage is selected so that each of the plurality of results is an indication of a different level of a shock.

17. A method of shock detection, the method comprising acts of:
   providing an electrical energy generating device to generate a voltage over a duration responsive to an acceleration;
   providing a first electrical storage device connected to the electrical energy generating device to receive a portion of the voltage over the duration and to thereby accumulate a charge;
   providing an output coupled to the electrical storage device to deliver a shock indication when at least a portion of the charge exceeds a first predetermined voltage; and
   controlling a machine based on the shock indication;
   wherein the shock is a vibration in the machine.

18. The method of claim 17 wherein the controlling is at least one of reducing power or undergoing an emergency stop of the machine.

* * * * *